US012719463B2

(12) United States Patent
Li

(10) Patent No.: US 12,719,463 B2
(45) Date of Patent: Aug. 25, 2026

(54) DELAY CHAIN AND METHOD OF OPERATING SAME

(71) Applicant: TAIWAN SEMICONDUCTOR MANUFACTURING COMPANY, LTD., Hsinchu (TW)

(72) Inventor: Shenggao Li, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/749,857

(22) Filed: Jun. 21, 2024

(65) Prior Publication Data

US 2025/0260398 A1 Aug. 14, 2025

Related U.S. Application Data

(60) Provisional application No. 63/551,883, filed on Feb. 9, 2024.

(51) Int. Cl.
*H03K 5/134* (2014.01)
*H03K 5/135* (2006.01)

(52) U.S. Cl.
CPC ............. *H03K 5/134* (2014.07); *H03K 5/135* (2013.01)

(58) Field of Classification Search
None
See application file for complete search history.

(56) References Cited

U.S. PATENT DOCUMENTS 6,046,620 A * 4/2000 Relph .................... H03K 5/133 327/284
10,367,493 B1 7/2019 Addepalli et al.
12,388,462 B2 * 8/2025 Yin ........................ H03K 19/20
2021/0258904 A1 8/2021 Lee
2021/0409033 A1 12/2021 Moon et al.
2023/0387934 A1 11/2023 Zhao et al.

FOREIGN PATENT DOCUMENTS

KR 10-2022-0099345 7/2022
KR 10-2023-0083248 6/2023

* cited by examiner

*Primary Examiner* — Cassandra F Cox
(74) *Attorney, Agent, or Firm* — Hauptman Ham, LLP

(57) ABSTRACT

A delay chain includes: delay stages coupled in series, each delay stage including a driver device coupled between an input node and an output node of the delay stage, and a capacitor digital-to-analog converter (CDAC) coupled to the output node of the delay stage; at least one of the CDACs being a separately adjustable (SA) type of CDAC (SA_C-DAC) that is separately adjustable relative to at least another one of the CDACs; and a controller configured to adjust the at least one CDAC.

20 Claims, 13 Drawing Sheets

114, digitally-controlled oscillator

116 nd_OUT 102, delay chain nd_IN

324

| Row # of This Table | Count of SCC_cells in thermo-code-ON state | RW(0)-RW(7) concatenated as upper bits of thermo-code | CL(0)-CL(7) concatenated as lower bits of thermo-code | Components ON/OFF state in active row (1=ON; 0=OFF) |
|---|---|---|---|---|
| 1 | 0 | 0000 0000 | 0000 000x | 0000 0000 |
| 2 | 1 | 0000 0000 | 1000 000x | 1000 0000 |
| 3 | 2 | 0000 0000 | 1100 000x | 1100 0000 |
| 4 | 3 | 0000 0000 | 1110 000x | 1110 0000 |
| 5 | 4 | 0000 0000 | 1111 000x | 1111 0000 |
| 6 | 5 | 0000 0000 | 1111 100x | 1111 1000 |
| 7 | 6 | 0000 0000 | 1111 110x | 1111 1100 |
| 8 | 7 | 0000 0000 | 1111 111x | 1111 1110 |
| 9 | 8 | 0000 0000 | 1111 111x | 1111 1111 |
| 10 | 9 | 1000 0000 | 0111 111x | 1000 0000 |
| 11 | 10 | 1000 0000 | 0011 111x | 1100 0000 |
| 12 | 11 | 1000 0000 | 0001 111x | 1110 0000 |
| 13 | 12 | 1000 0000 | 0000 111x | 1111 0000 |
| 14 | 13 | 1000 0000 | 0000 011x | 1111 1000 |
| 15 | 14 | 1000 0000 | 0000 001x | 1111 1100 |
| 16 | 15 | 1000 0000 | 0000 000x | 1111 1110 |
| 17 | 16 | 1000 0000 | 0000 000x | 1111 1111 |
| ⋮ | ⋮ | ⋮ | ⋮ | ⋮ |

| Row # of This Table | RW(0)-RW(7) concatenated as upper bits of thermo-code | CL(0) | CL(1)-CL(7) concatenated as lower bits of thermo-code | CL(8) | SCC_cell in fractional state (larger font) |
|---|---|---|---|---|---|
| 1 | 0000 0000 | 1 | 0000 000 | 0 | 0000 0000 |
| 2 | 0000 0000 | 1 | 1000 000 | 0 | 1000 0000 |
| 3 | 0000 0000 | 1 | 1100 000 | 0 | 1100 0000 |
| 4 | 0000 0000 | 1 | 1110 000 | 0 | 1110 0000 |
| 5 | 0000 0000 | 1 | 1111 000 | 0 | 1111 0000 |
| 6 | 0000 0000 | 1 | 1111 100 | 0 | 1111 1000 |
| 7 | 0000 0000 | 1 | 1111 110 | 0 | 1111 1100 |
| 8 | 0000 0000 | 1 | 1111 111 | 0 | 1111 1110 |
| 9 | 0000 0000 | 0 | 1111 111 | 1 | 0000 0000 |
| 10 | 1000 0000 | 0 | 0111 111 | 1 | 1000 0000 |
| 11 | 1000 0000 | 0 | 0011 111 | 1 | 1100 0000 |
| 12 | 1000 0000 | 0 | 0001 111 | 1 | 1110 0000 |
| 13 | 1000 0000 | 0 | 0000 111 | 1 | 1111 0000 |
| 14 | 1000 0000 | 0 | 0000 011 | 1 | 1111 1000 |
| 15 | 1000 0000 | 0 | 0000 001 | 1 | 1111 1100 |
| 16 | 1000 0000 | 0 | 0000 000 | 1 | 1111 1110 |
| 17 | 1000 0000 | 1 | 0000 000 | 0 | 0000 0000 |
| ⋮ | ⋮ | ⋮ | ⋮ | ⋮ | ⋮ |

FIG. 5

DELAY CHAIN AND METHOD OF OPERATING SAME

PRIORITY CLAIM

This application claims the priority of U.S. Provisional Application No. 63/551,883, filed Feb. 9, 2024, which is incorporated herein by reference in its entirety.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3 is a table, in accordance with some embodiments.

FIG. 5 is a table, in accordance with some embodiments.

DETAILED DESCRIPTION

Figure 1A:
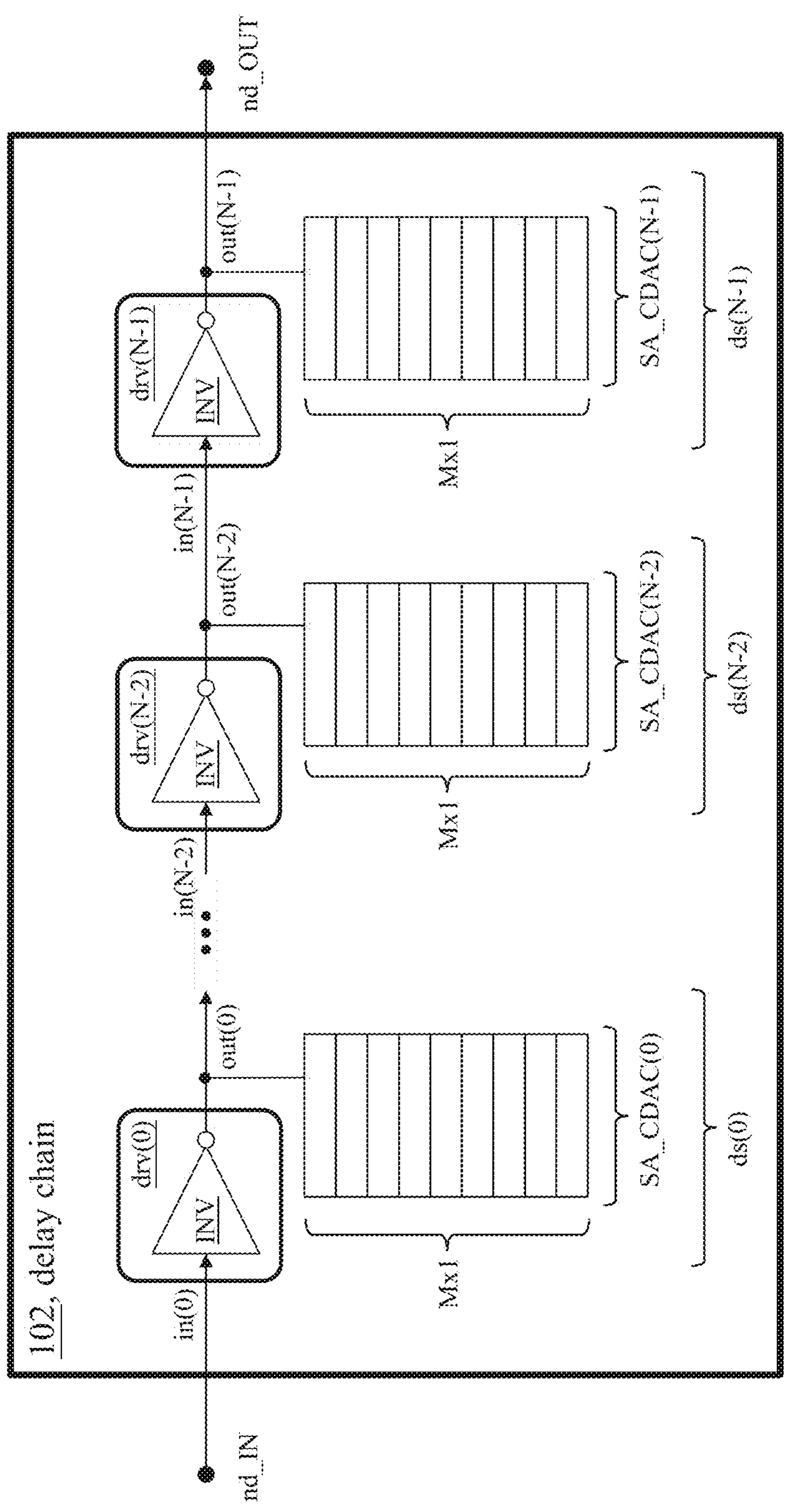
FIGS. 1A-1D are corresponding schematic diagrams, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for case of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a delay chain includes: delay stages coupled in series, each delay stage including a driver device coupled between an input node and an output node of the delay stage, and a capacitor digital-to-analog converter (CDAC) coupled to the output node of the delay stage; at least one of the CDACs being a separately adjustable (SA) type of CDAC (SA_CDAC) that is separately adjustable relative to at least another one of the CDACs; and a controller configured to adjust the at least one CDAC.

In some embodiments, the at least one SA_CDAC is a one-dimensional array of separately couplable capacitance (SCC) cells (SCC_cells). In some embodiments, 'couplable' is understood to mean capable of being coupled to something, e.g., a first SCC_cell of a given SA_CDAC is capable of being coupled to the output node of the given SA_CDAC. In some embodiments, for the first SCC_cell and a second SCC_cell of the given SA_CDAC, 'separately couplable' is understood to mean that coupling/decoupling the first SCC_cell to/from the output node of the given SA_CDAC is capable of being performed separately (or independently) from coupling/decoupling the second SCC_cell to/from the output node of the given SA_CDAC. Accordingly, in such embodiments, each of the first and second SCC_cells is described as being separately (or independently) couplable to the output node of the given SA_CDAC. In such embodiments, the one-dimensional arrays include rows and a single column, and each row includes a single SCC_cell; and the controller is further configured to selectively couple none or some or all of the SCC_cells in the at least one SA_CDAC to the output node of the corresponding delay stage. In some embodiments, the at least one SA_CDAC is a one-dimensional array of separately controllable capacitance (SCC) cells (SCC_cells). In some embodiments, describing an SCC_cell as being controllable is understood to mean that the coupling between the SA_CDAC and the output node of the given SA_CDAC is selectively makeable or breakable. In some embodiments, for a first SCC_cell and a second SCC_cell of a given SA_CDAC, 'separately controllable' is understood to mean that coupling/decoupling the first SCC_cell to/from the output node of the given SA_CDAC is capable of being performed separately (or independently) from coupling/decoupling the second SCC_cell to/from the output node of the given SA_CDAC.

In combination with an even-row decoder (see FIGS. 2B and 2D, 4B and 4D, or the like) and an odd-row decoder (see FIGS. 2C and 4C, 2E and 4E, or the like) correspondingly included in each of the SCC_cells, the use of row-address signals RW(i) and column-addressing signals CL(i) to form a thermometer code reduces the total number of control lines needed for the SA_CDACs as compared to a CDAC-based delay chain according to another approach, where the CDACs of the other approach are not separately adjustable. The reduced total number of control lines for the SA_C-

DACs results in the corresponding delay chain occupying a smaller area (having a smaller footprint) as compared to the CDAC-based delay chain according to another approach.

FIG. 1A is a schematic diagram of a delay chain 102, in accordance with some embodiments.

Delay chain 100 has an input node nd_IN and an output node nd_OUT. Delay chain 100 includes delay stages ds(0), . . . , ds(N−2) and ds(N−1) coupled in series between input node nd_IN and output node nd_OUT, where N is an integer and 2≤N.

Taking delay stage ds(j) as being representative of each of delay stages ds(0)-ds(N−1), delay stage ds(j) includes: a driver device drv(j) coupled between an input node in(j) and an output node out(j) of the delay stage ds(j); and a capacitor digital-to-analog converter (CDAC), and more particularly a separately adjustable (SA) type of CDAC(j) (SA_CDAC(j)), coupled to output node out(j) of delay stage ds(j). In some embodiments, describing SA_CDAC(j) as being separately adjustable is understood as SA_CDAC(j) being separately adjustable relative to at least another one of the CDACs.

In FIG. 1A, each CDAC is an SA_CDAC. In some embodiments, at least one but fewer than all of SA_CDAC (0)-SA_CDAC(N−1) is a type of CDAC other than an SA_CDAC.

Each of SA_CDAC(0)-SA_CDAC(N−1) is a one-dimensional M×1 array of separately couplable capacitance (SCC) cells (SCC_cells) (see FIG. 2B-2C, 4B-4C, or the like). Each of SA_CDAC(0)-SA_CDAC(N−1) is configured and controlled to be a monotonic CDAC.

In FIG. 1A, taking delay stage ds(j) as being representative of each of delay stages ds(0)-ds(N−1), driver device drv(j) includes an inverter INV coupled between input node in(j) and output node out(j) of delay stage ds(j). In some embodiments, driver device drv(j) includes a buffer (not shown) coupled between input node in(j) and output node out(j) of delay stage ds(j).

In FIG. 1A, a signal provided to input node nd_IN of delay chain 102 experiences an overall propagation delay as the signal propagates to output node nd_OUT of delay chain 102. The overall propagation delay is the sum of incremental propagation delays introduced as the signal correspondingly propagates through delay stages ds(0)-ds(N−1) of delay chain 102. Where SA_CDAC(j) is representative of each of SA_CDAC(0)-SA_CDAC(N−1), SA_CDAC(j) represents a controllable capacitive load on output node out(j) of delay stage ds(j). Adjusting the capacitive load represented by SA_CDAC(j) has an effect of adjusting the incremental propagation delay introduced by corresponding delay stage ds(j). In some embodiments, separately adjusting the capacitive loads correspondingly represented by SA_CDAC(j)-SA_CDAC(N−1) is referred to as tuning the overall propagation delay of delay chain 102. As each of SA_CDAC(0)-SA_CDAC(N−1) is monotonic, delay chain 102 facilitates monotonic delay tuning.

In FIG. 1A, SA_CDAC(0)-SA_CDAC(N−1) are controlled via addressing by signals CL(0)-CL(N−1) and RW(0)-RW(M−1). A controller (112 FIG. 1B) is configured to generate signals CL(0)-CL(N−1) and RW(0)-RW(M−1) based on a digital thermometer encoding scheme (see FIG. 2A-2E, 3, 4A-4E, 5, or the like). Accordingly, delay chain 102 is described as a digitally controlled type of delay chain.

In general, CDACs, e.g., SA_CDAC(0)-SA_CDAC(N−1), facilitate clock synchronization, communication in general such as circuit-to-circuit communication (e.g., in a compute-in-memory (CIM) system), digital-to-analog conversion (DAC), analog-to-digital conversion (ADC), waveform generation, audio applications, or the like. As delay chain 102 facilitates monotonic delay tuning, delay chain 102 facilitates, e.g., low jitter clock generation for a high speed serializer/deserializer (SERDES) device, a die-to-die input/output (I/O) system, or the like.

Figure 1B:
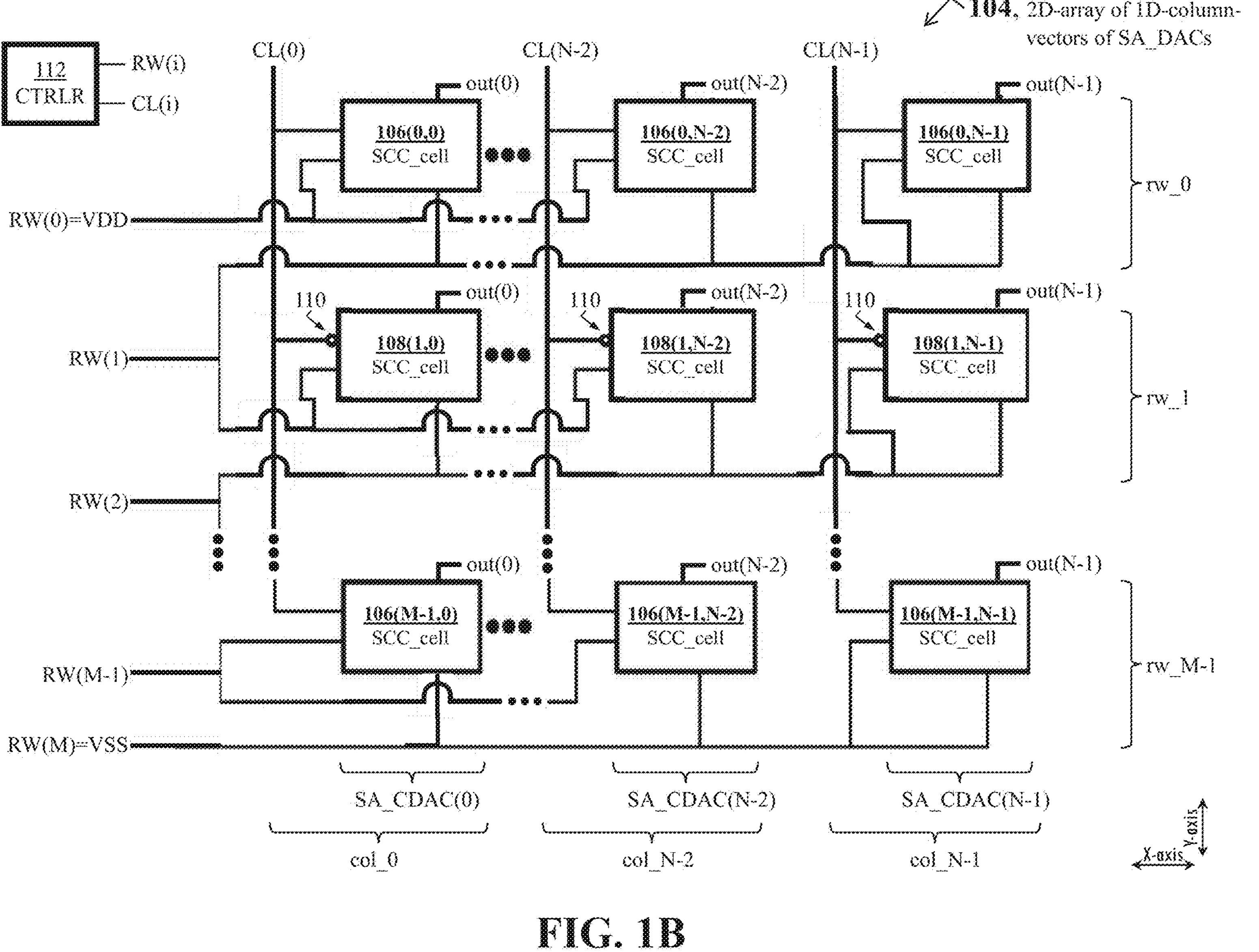

FIG. 1B is a schematic diagram of an array 104, in accordance with some embodiments.

Array 104 includes: SCC_cells 106(0,0)-106(0,N−1); SCC_cells 108(1,0)-108(1,N−1); and SCC_cells 106(M−1, 0)-106(M−1,N−1). In FIG. 1B, the SCC_cells are treated as black boxes; see FIGS. 2B-2C, 4B-4C, or the like, for a discussion of internal configurations of the SCC_cells.

Together, SCC_cells 106(0,0), 108(1,0) and 106(M−1,0) represent SA_CDAC(0) of delay stage ds(0). Together, SCC_cells 106(0,N−2), 108(1,N−2) and 106(M−1,N−2) represent SA_CDAC(1) of delay stage ds(N−2). Together, SCC_cells 106(0,N−1), 108(1,N−1) and 106(M−1,N−1) represent SA_CDAC(N−1) of delay stage ds(N−1).

To facilitate coordinated control of delay line 102, the N instances of one-dimensional M×1 arrays of SCC_cells in FIG. 1A, i.e., SA_CDAC(0)-SA_CDAC(N−1), are treated as a whole according to some embodiments. Treated as a whole, SA_CDAC(0)-SA_CDAC(N−1) together represent an M×N array of SCC_cells. SA_CDAC(0)-SA_CDAC(N−1) correspondingly represent columns col_0-col_N−1 of array 104.

Array 104 receives: column-addressing signals CL(0)-CL (N−1) corresponding to columns col(0)-col(N−1) in array 104; row-addressing signals RW(0)-RW(M−1) corresponding to rows rw_0-rw_M−1 and row-addressing signal RW(M) corresponding to an imaginary row rw_M. Signals CL(0)-CL(N−1) and RW(0)-RW(M−1) are generated by a controller 112. Controller 112 is further configured to generate signals CL(0)-CL(N−1) and RW(0)-RW(M−1) based on a digital thermometer encoding scheme (see FIG. 2A-2E, 3, 4A-4E, 5, or the like) and thereby selective couple some, none or all of the SCC_cells correspondingly in SA_CDAC (0)-SA_CDAC(N−1) to corresponding nodes out(0)-out(N−1) in delay stages ds(0)-ds(N−1).

In array 104, even-numbered rows include SCC_cells 106(*i,j*), where each of i and j are corresponding non-negative integers, i is an even number, 0≤i≤(M−1) and 0≤j≤(N−1). Odd-numbered rows include SCC_cells 108 (*i,j*), where i is an odd number. Even row rw_0 of array 104 includes SCC_cells 106(0,0)-106(0,N−1). Odd row rw_1 of array 104 includes SCC_cells 108(1,0)-108(1,N−1). Row rw_M−1 of array 104 includes SCC_cells 106(M−1,0)-106 (M−1,N−1).

Each of SCC_cells 106(*i,j*) and 108 (*i,j*) has three inputs and one output. Each of SCC_cells 106(*i*,0)-106(*i*,N−2) and 108(*i*,0)-108(*i*,N−2) is configured to receive three different signals correspondingly on the three inputs (see FIG. 2D, 4D, or the like). By contrast, the SCC_cells in the last column col_N−1 receive fewer signals. each of SCC_cells 106(*i*,N−1) and 108(*i*,N−1) is configured to receive two different signals on three inputs, i.e., two of the inputs are configured to receive the same signal (see FIG. 2E, 4E, or the like).

In FIG. 1B, the SCC_cells in the even rows have the default SCC_cell configuration and the SCC_cells in the odd rows have a different configuration as compared to the SCC_cells in the even rows. As such, the SCC_cells in rows rw_0, rw_2, etc., are different than the SCC_cells in rows rw_1, rw_3, etc. In some embodiments, the SCC_cells in array 104 are described as having row-number-parity-specific configurations. The use of row-number-parity-specific configurations for the SCC_cells in array 104 facilitates gray-code-compliant adjustment of SA_CDAC(0)-SA_C-

DAC(N−1), i.e., of the SCC_cells in array 104, and gray-code-compliant adjustment facilitates monotonic adjustment of the same.

In array 104, each of the SCC_cells in the even rows include the same components. Each of the SCC_cells in the odd rows include the same components of the SCC_cells in the even rows however one of the inputs in each of the SCC_cells in each of the even rows is inverted as indicated by prefixed inversion bubble 110. In some embodiments, each inverted input is described as being an active low input. Regarding FIG. 1B, in some embodiments, the SCC_cells in the odd rows have the default SCC-cell configuration and the SCC_cells in the even rows have the different configuration as compared to the SCC_cells in the odd rows which represents the converse of the even versus odd rows SCC_ cell configuration relationship shown in FIG. 1B.

In general, the output of each of SCC_cells 106(*i,j*) and 108 (*i,j*) in column col(j) is coupled to output node out(j) of the delay stage ds(j). The output of each of SCC_cells 106(0,0), 108(1,0) and 106(M−1,0) in column col(0) is coupled to output node out(0) of the delay stage ds(0). The output of each of SCC_cells 106(0,N−2), 108(1,N−2) and 106(M−1,N−2) in column col(N−2) is i coupled to output node out(N−2) of the delay stage ds(N−2). The output of each of SCC_cells 106(0,N−1), 108(1,N−1) and 106(M−1, N−1) in column col(N−1) is coupled to output node out(N−1) of the delay stage ds(N−1).

One input of each of SCC_cells 106(0,0), 108(1,0) and 106(M−1,0) in column col(0) is configured to receive column-addressing signal CL(0). One input of each of SCC_ cells 106(0,N−2), 108(1,N−2) and 106(M−1,N−2) in column col(N−2) is configured to receive column-addressing signal CL(N−2). One input of each of SCC_cells 106(0,N−1), 108(1,N−1) and 106(M−1,N−1) in column col(N−1) is configured to receive a column-addressing signal CL(N−1).

Two inputs of each of SCC_cells 106(0,0)-106(0,N−2) in row rw_0 are configured to receive row-addressing signal RW(0). One input of each of SCC_cells 106(0,0)-106(0,N−2) in row rw_0 is configured to receive row-addressing signal RW(1). Two inputs of SCC_cell 106(0,N−1) in row rw_0 are configured to receive row-addressing signal RW(1).

Two inputs of each of SCC_cells 108(1,0)-108(1,N−2) in row rw_1 are configured to receive row-addressing signal RW(1). One input of each of SCC_cells 108(1,0)-108(1,N−2) in row rw_1 is configured to receive row-addressing signal RW(2). Two inputs of SCC_cell 108(1,N−1) in row rw_1 are configured to receive row-addressing signal RW(2).

Two inputs of each of SCC_cells 106(M−1,0)-106(M−1, N−2) in row rw_M−1 are configured to receive row-addressing signal RW(M−1). One input of each of SCC_cells 106(M−1,0)-106(M−1,N−2) in row rw_M−1 is configured to receive row-addressing signal RW(M). Two inputs of each of SCC_cells 106(M−1,0)-106(M−1,N−2) in row rw_M−1 are configured to receive row-addressing signal RW(M).

In FIG. 1B, row-addressing signal RW(0) is coupled to a first reference voltage VDD. Row-addressing signal RW(M) corresponding to an imaginary row rw_M is coupled to a second reference voltage VSS. Column-addressing signal CL(N−1) is coupled to either the first reference voltage VDD or the second reference voltage VSS. In some embodiments, the first and second reference voltages have corresponding values other than VDD and VSS.

Figures 1C, 1D:
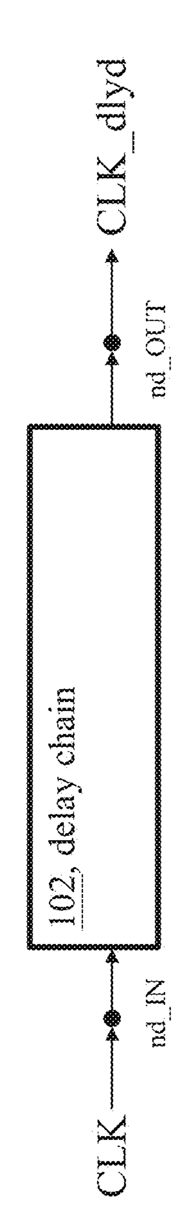

FIG. 1C is a schematic diagram of an oscillator 114, in accordance with some embodiments.

Oscillator 114 represents an application of delay chain 102 in that oscillator 114 includes digitally-controlled delay chain. Accordingly, oscillator 114 is described as a digitally-controlled type of oscillator. In some embodiments, oscillator 114 is described as a phase-locked loop (PLL).

In FIG. 1C, output node nd_OUT of delay chain 102 is coupled to input node nd_IN of delay chain 102 via a feedback coupling 116.

FIG. 1D is a schematic diagram of a delay line 118, in accordance with some embodiments.

Delay line 118 represents an application of delay chain 102 in that delay line 118 includes digitally-controlled delay chain. Accordingly, delay line 118 is described as a digitally-controlled type of delay line. In some embodiments, delay line 118 is described as a delay-locked loop (DLL).

In FIG. 1D, input node nd_IN of delay chain 102 receives a clock signal CLK which experiences an overall propagation delay as signal CLK propagates to output node nd_OUT of delay chain 102. A signal CLK_dlyd is generated by delay chain 102 on output node nd_OUT which represents a delay version of signal CLK, and where the text string dlyd is an abbreviation of delayed.

Figures 2A, 2B, 2C, 2D, 2E:
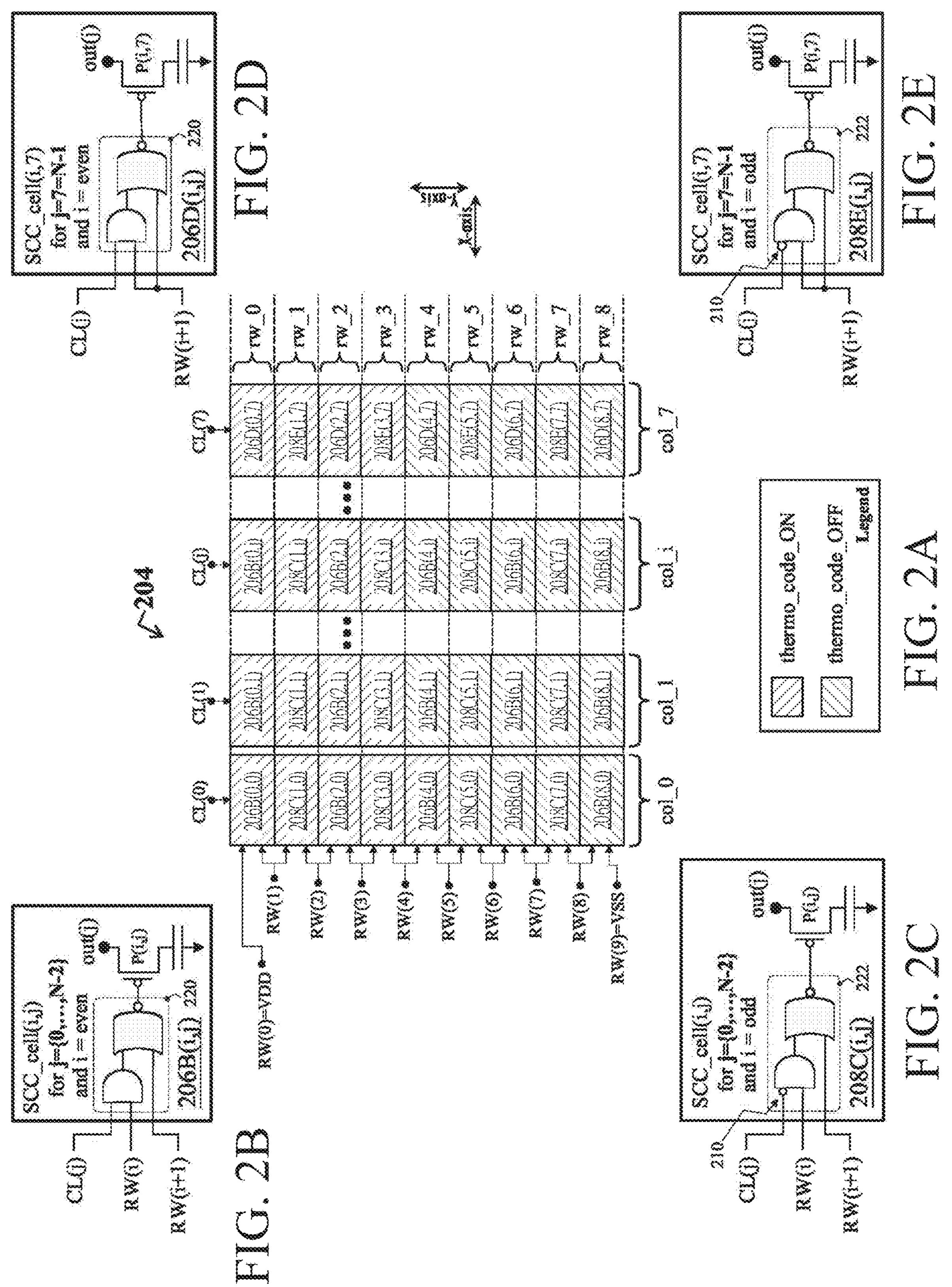
FIGS. 2A-2E are corresponding schematic diagrams, in accordance with some embodiments.

FIG. 2A is a schematic diagram of an array 204, in accordance with some embodiments.

In some embodiments, FIG. 2A is described as a simplified version of FIG. 1B and accordingly array 204 is described as a simplified version of array 104. FIG. 2A shows more of the columns in array 204 than FIG. 1B shows of the columns in array 104, the latter showing three columns, namely col(0), col(N−2) and col(N−1). By contrast, FIG. 2A shows four columns of array 204, namely columns col(0), col(1), col(j) and col(N−1).

In FIG. 2A, for simplicity of illustration, it is assumed that the number of rows M is M=9 and the number of columns N is N=8. As such, array 204 includes rows rw_0-rw_8 and columns col_0-col_7. In some embodiments, M and N have corresponding values other than M=9 and N=8.

Even-numbered rows include SCC_cells 206B(i,j) and 206D(i,j). Odd-numbered rows include SCC_cells 208C(i,j) and 208E(i,j), where i is an odd number. For example, even row rw_0 of array 204 includes SCC_cells 206B(0,0)-206B (0,6) and 208D(0,7). For example, odd row rw_1 of array 204 includes SCC_cells 208C(1,0)-208C(1,6) and 208E(1, 7).

Internal configurations of even-row SCC_cells 206B(i,j) and 206D(i,j) are shown correspondingly in FIGS. 2B and 2D. Internal configurations of odd-row SCC_cells 208C(i,j) and 208D(i,j) are shown correspondingly in FIGS. 2C and 2E.

In FIG. 2A, SCC_cells 206B(i,j), 206D(i,j), 208C(i,j) and 208E(i,j) are controlled via addressing by signals CL(0)-CL (N−1) and RW(0)-RW(9). A controller (see 112 FIG. 1B) is configured to generate signals CL(0)-CL(N−1) and RW(0)-RW(9) based on a digital thermometer encoding scheme (see FIG. 3, or the like).

It is to be recalled that each column col(j) represents SA_CDAC(j) in corresponding delay stage ds(j) (see FIGS. 1A-1B). In the example of FIG. 2A, each of SCC_cells 206B(i,j), 206D(i,j), 208C(i,j) and 208E(i,j) includes a capacitor (see FIG. 2B-2E, or the like) that is separately couplable to corresponding output nodes out(0)-out(7) of delay stage ds(0)-ds(7) in accordance with the digital thermometer encoding scheme.

In the example of FIG. 2A, M×N=9×8=72 capacitors are separately couplable to corresponding output nodes out(0)- out(7). Signal RW(0) is coupled to voltage VDD. Signal RW(M), which corresponds to an imaginary row rw_9 is coupled to voltage VSS.

In FIG. 2A, the digital thermometer code is formed from signals RW(0)-RW(8) and CL(0)-CL(7).

The digital thermometer encoding scheme of FIG. 2A separately couples none, some or all the capacitors in SCC_cells 206B(i,j), 206D(i,j), 208C(i,j) and 208E(i,j) to corresponding output nodes out(0)-out(7) row-wise sequentially as follows: row rw(0) from 206B(0,0) to 206B(0,1) to . . . 206B(0,j) to . . . 206D(0,7); then row rw(1) from 208C(1,0) to . . . 208C(1,1) to . . . 208C(1,j) to . . . 208E(1,7); then row rw(2) from 206B(2,0) to . . . 206D(2,7); then row rw(3) from 208C(3,0) to . . . 208E(3,7); . . . then row rw(7) from 208C(7,0) to . . . 208C(7,1) to . . . 208C(7,j) to . . . 208D(7,7); and then row rw(8) from 206B(8,0) to . . . 206B(8,1) to . . . 206B(8,j) to . . . 206D(8,7). Such row-wise sequential coupling of capacitors changes the coupling-state of only one of the corresponding capacitors changes for each change in the value of the thermometer code, and thus is gray-code compliant and monotonic. Gray code encoding produces a string of binary digits for which any two successive values of the string differ only in the value of one of the binary digits of the string. In some embodiments, a gray code is referred to as a reflected binary (RB) code. In some embodiments, gray-code-compliant adjustment of SA_CDAC(0)-SA_CDAC(N−1) connotes such row-wise sequential coupling of capacitors in that the coupling-state of only one of the corresponding capacitors changes for each change in the value of the thermometer code.

In some embodiments, when the capacitor of SCC_cell 206B(i,j), 206D(i,j), 208C(i,j) or 208E(i,j) is coupled to corresponding output node out(j), then SCC_cell 206B(i,j), 206D(i,j), 208C(i,j) or 208E(i,j) is described as being turned on. And when the capacitor of SCC_cell 206B(i,j), 206D(i,j), 208C(i,j) or 208E(i,j) is not coupled to corresponding output node out(j), then SCC_cell 206B(i,j), 206D(i,j), 208C(i,j) or 208E(i,j) is described as being turned off.

In some embodiments, when the capacitor of SCC_cell 206B(i,j), 206D(i,j), 208C(i,j) or 208E(i,j) is coupled to corresponding output node out(j), then SCC_cell 206B(i,j), 206D(i,j), 208C(i,j) or 208E(i,j) is described as being in a thermometer-code-ON state. And when the capacitor of SCC_cell 206B(i,j), 206D(i,j), 208C(i,j) or 208E(i,j) is not coupled to corresponding output node out(j), then SCC_cell 206B(i,j), 206D(i,j), 208C(i,j) or 208E(i,j) is described as being in a thermometer-code-OFF state. In the example of FIG. 2A, the following is assumed: SCC_cells 206B(i,j), 206D(i,j), 208C(i,j) and 208E(i,j) included in a first range from SCC_cell 206B(0,0) to SCC_cell 206B(4,0) are in the thermometer-code-ON state; and SCC_cells 206B(i,j), 206D(i,j), 208C(i,j) and 208E(i,j) included in a second range from SCC_cells 206B(4,1) through 206D(8,7) are in the thermometer-code-OFF state.

In combination with decoders (see FIG. 2B-2D, 4B-4D, or the like) correspondingly included in each of SCC_cell 206B(i,j), 206D(i,j), 208C(i,j) and 208E(i,j), the use of signals RW(0)-RW(8) and CL(0)-CL(7) to form the thermometer code reduces the total number of control lines needed for the SA_CDACs corresponding to columns col (0)-col(7) as compared to a CDAC-based delay chain according to another approach. The reduced total number of control lines for the SA_CDACs corresponding to columns col(0)-col(7) results in the corresponding delay chain occupying a smaller area (having a smaller footprint) as compared to the CDAC-based delay chain according to another approach.

FIG. 2B is a schematic diagram of SCC_cell 206B(i,j) for i=even and j={0, . . . , N−2), in accordance with some embodiments.

FIG. 2B extends the example of FIG. 2A. SCC_cell 206B(i,j) is used in even rows of array 204 of FIG. 2A, or the like. Recalling that N=8 in the example of FIG. 2A, SCC_cell 206B(i,j) represents SCC_cells 206B(0,0)-206B(8,6).

SCC_cell 206B(i,j) includes a decoder 220, a switch P(i,j) and a capacitor. Switch P(i,j) is coupled between output node out(j) of corresponding delay stage ds(j) and the capacitor. The capacitor is coupled between switch P(i,j) and VSS. A control input of switch P(i,j) is coupled to the output of decoder 220. Decoder 220 has three inputs correspondingly coupled to signals CL(j), RW(i) and RW(i+1).

In FIG. 2B, switch P(i,j) is a field-effect transistors (FET) having a P-type dopant used for positive-channel metal-oxide semiconductor (PMOS) transistor technologies, i.e., a PFET. When the output of decoder 220 is a logical zero, PFET P(i,j) turns on, i.e., switch P(i,j) is in the closed state and the capacitor is coupled to output node out(j). When the output of decoder 220 is a logical one, PFET P(i,j) turns off, i.e., switch P(i,j) is in the open state and, in effect, the capacitor is not coupled to output node out(j). In some embodiments, the switch is an FET having an N-type dopant used for negative-channel metal-oxide semiconductor (NMOS) transistor technologies, i.e., an NFET.

Regarding FIG. 2B, in some embodiments, the capacitor correspondingly of each instance of SCC_cell 206B(i,j) is described as being separately couplable to output node out(j). In some embodiments, the description of each instance of SCC_cell 206B(i,j) as being separately couplable to output node out(j) is understood to mean that controlling a first instance of switch P(i,j) of a first instance of SCC_cell 206B(i,j) to turn on/off is performed separately (or independently) from controlling a second instance of switch P(α,β) of a second instance of SCC_cell 206B(i,j) to turn on/off. Accordingly, in such embodiments, the on/off state of the first instance of switch P(i,j) is described as being separately (or independently) controllable relative to the on/off state of the second instance of switch P(i,j).

Decoder 220 includes a logical AND gate and a logical NOR gate. The AND gate has two inputs correspondingly configured to receive signals CL(j) and RW(i). The NOR gate has two inputs correspondingly configured to receive the output of the AND gate and RW(i+1). In some embodiments, decoder 220 is described as a logical AND-OR-INVERT (AOI) gate.

In some embodiments, the thermometer-code-ON state is described as driving SCC_cell 206B(i,j), 206D(i,j), 208C(i,j) or 208E(i,j) according to a duty cycle of 100%, or as SCC_cell 206B(i,j), 206D(i,j), 208C(i,j) or 208E(i,j) having a duty cycle of 100%. In such embodiments, conversely, the thermometer-code-OFF state is described as driving SCC_cell 206B(i,j), 206D(i,j), 208C(i,j) or 208E(i,j) according a duty cycle of 0% or as SCC_cell 206B(i,j), 206D(i,j), 208C(i,j) or 208E(i,j) having a duty cycle of 0%. In some embodiments, is described as being controlled according to a binary coupling scheme.

FIG. 2C is a schematic diagram of SCC_cell 208C(i,j) for i=odd and j={0, . . . , N−2), in accordance with some embodiments.

FIG. 2C extends the example of FIG. 2A. SCC_cell 208C(i,j) is used in odd rows of array 204 of FIG. 2A, or the like. Recalling that N=8 in the example of FIG. 2A, SCC_cell 208C(i,j) represents SCC_cells 208C(1,0)-208C(7,6).

SCC_cell 208C(i,j) of FIG. 2C is similar to SCC_cell 206B(i,j) of FIG. 2B. In some embodiments, the capacitor correspondingly of each instance of SCC_cell 206C(i,j) is described as being separately couplable to output node out(j). For brevity, the discussion will focus on differences of SCC_cell 208C(i,j) as compared to SCC_cell 206B(i,j) rather than on similarities.

SCC_cell 208C(i,j) differs from SCC_cell 206B(i,j) in that one of the inputs of SCC_cell 208C(i,j) is inverted. More particularly, one of the inputs of the AND gate of decoder 222, namely the input of the AND gate configured to receive signal CL(j), is inverted as indicated by prefixed inversion bubble 210. In some embodiments, the inverted input is described as being an active low input. In some embodiments, SCC_cell 208C(i,j) does not have the inverted input but instead SCC_cell 206B(i,j) has the inverted input, i.e., the AND gate of decoder 220 which is configured to receive signal CL(j) is inverted.

Similar to decoder 220 of FIG. 2B, in some embodiments, decoder 222 of FIG. 2C is described as a logical AND-OR-INVERT (AOI) gate.

FIG. 2D is a schematic diagram of SCC_cell 206D(i,7) for i=even and j=7, in accordance with some embodiments.

FIG. 2D extends the example of FIG. 2A. SCC_cell 206D(i,7) is used in even rows of the last column col_N−1 of the array, i.e., col_7 in the context of array 204 of FIG. 2A, or the like.

SCC_cell 206D(i,7) of FIG. 2D is similar to SCC_cell 206B(i,j) of FIG. 2B. In some embodiments, the capacitor correspondingly of each instance of SCC_cell 206D(i,j) is described as being separately couplable to output node out(j). For brevity, the discussion will focus on differences of SCC_cell 206D(i,7) of FIG. 2D as compared to SCC_cell 206B(i,j) of FIG. 2B rather than on similarities.

Though SCC_cell 206D(i,7) has three inputs, nevertheless SCC_cell 206D(i,7) is configured to receive fewer signals than SCC_cell 206B(i,j) of FIG. 2B. SCC_cell 206D(i,7) is configured to receive two different signals on three inputs, i.e., two of the inputs are configured to receive the same signal. SCC_cell 206D(i,7) is not configured to receive signal RW(i). In particular, not only is one of the inputs of the NOR gate of decoder 220 configured to receive signal RW(i+1), but also one of the inputs of the AND gate of decoder 220 is configured to receive signal RW(i+1). By contrast, the corresponding input of the AND gate of decoder 220 of FIG. 2B is configured to receive signal RW(i).

FIG. 2E is a schematic diagram of SCC_cell 208E(i,7) for i=odd and j=7, in accordance with some embodiments.

FIG. 2E extends the example of FIG. 2A. SCC_cell 208E(i,7) is used in odd rows of the last column col_N−1 of the array, i.e., col_7 in the context of array 204 of FIG. 2A, or the like.

SCC_cell 208E(i,7) of FIG. 2E is similar to SCC_cell 208C(i,j) of FIG. 2C. In some embodiments, the capacitor correspondingly of each instance of SCC_cell 206D(i,j) is described as being separately couplable to output node out(j). For brevity, the discussion will focus on differences of SCC_cell 208E(i,7) of FIG. 2E as compared to SCC_cell 208C(i,j) of FIG. 2C rather than on similarities.

Though SCC_cell 208E(i,7) has three inputs, nevertheless SCC_cell 208E(i,7) is configured to receive fewer signals than SCC_cell 208C(i,j) of FIG. 2C. SCC_cell 208E(i,7) is configured to receive two different signals on three inputs, i.e., two of the inputs are configured to receive the same signal. SCC_cell 208E(i,7) is not configured to receive signal RW(i). In particular, not only is one of the inputs of the NOR gate of decoder 222 configured to receive signal RW(i+1), but also one of the inputs of the AND gate of decoder 222 is configured to receive signal RW(i+1). By contrast, the corresponding input of the AND gate of decoder 222 of FIG. 2C is configured to receive signal RW(i).

In each of SCC_cell 206D(i,7) of FIG. 2D and SCC_cell 208E(i,7) of FIG. 2E, configuring two of the inputs to receive signal RW(i+1) has the corresponding effects of causing decoders 220 and 222 to function as logical inverter gates with respect to signal RW(i+1). In other words, in each of SCC_cell 206D(i,7) of FIG. 2D and SCC_cell 208E(i,7) of FIG. 2E, configuring two of the inputs to receive signal RW(i+1) has the corresponding effects of causing the state of signal CL(7) to have no effect on the output of decoders 220 and 222. In some embodiments, in light of such effects, signal CL(7) is described as a 'don't care' signal with respect to the operation of decoders 220 and 222. Accordingly, in such embodiments, signal CL(7) is configured according to another purpose, e.g., to reduce energy consumption, or noise, or the like.

A truth table for SCC_cell 206D(i,7) is shown below as Table 1.

TABLE 1

(SCC_cell 206D(i, 7))

| CL(7) | RW(i + 1) | AND | OR | NOR |
|---|---|---|---|---|
| 0 | 0 | 0 | 0 | 1 |
| 0 | 1 | 0 | 1 | 0 |
| 1 | 0 | 0 | 0 | 1 |
| 1 | 1 | 1 | 1 | 0 |

A truth table for SCC_cell 208E(i,7) is shown below as Table 2. The inversion of signal CL(7) is referred to as CL(7)_bar.

TABLE 2

(SCC_cell 208E(i, 7))

| CL(7) | CL(7)_bar | RW(i + 1) | AND | OR | NOR |
|---|---|---|---|---|---|
| 0 | 1 | 0 | 0 | 0 | 1 |
| 0 | 1 | 1 | 1 | 1 | 0 |
| 1 | 0 | 0 | 0 | 0 | 1 |
| 1 | 0 | 1 | 0 | 1 | 0 |

FIG. 3 is a table 324 showing partial values of a thermometer code, in accordance with some embodiments.

The table of FIG. 3 extends the example of FIG. 2A. As columns col_0-col_7 of array 204 of FIG. 2A represent corresponding SC_CDACs, Table 324 provides examples of how a thermometer code is used to adjust each of the SA_CDACs separately relative to the other SA_CDACs.

Table 324 includes: a first column (column 1) that shows the row-numbers assigned to the rows in Table 324; a second column (column 2) that shows the count of SCC_cells 206B(i,j), 206D(i,j), 208C(i,j) and 208E(i,j) that are in a thermometer-code-ON state; a third column (column 3) that shows signals RW(0)-RW(7) as corresponding binary digits concatenated to form the upper eight bits of the example thermometer code; a fourth column (column 4) that is specific to the 'last' ON-row (discussed below) of array 204, and where column 4 shows signals CL(0)-CL(7) as corresponding binary digits concatenated to form the lower eight bits of the example thermometer code; and a fifth column (column 5) that is specific to the 'last' ON-row (discussed below) of array 204, and where column 5 shows which, if any, of columns col_0-col_7 have SCC_cells 206B(i,j), 206D(i,j), 208C(i,j) or 208E(i,j) is in the thermometer-code-ON state.

The full example code represented by Table 324 is formed by concatenating signals RW(0)-RW(7) and CL(0)-CL(7) as corresponding binary digits representing the upper eight bits and lower eight bits of the example thermometer code in the context of the example of FIG. 2A. Table 324 is a partial listing of the permutations and combinations of values for the example thermometer code in the context of the example of FIG. 2A.

Column 3 of Table 324 considers each of rows rw_0-rw_7 as a whole in terms of the thermometer-code-ON state. Accordingly, each row rw_i as a whole is represented by a corresponding single binary digit in column 3 of Table 324. If all SCC_cells in the row rw_i are in the thermometer-code-ON state, then the binary digit representing row_i in column 3 of Table 324 is set to one (logical high). If fewer than all SCC_cells in the row rw_i are in the thermometer-code-ON state, then the binary digit representing row_i in column 3 of Table 324 is set to zero (logical low).

In some embodiments, the 'last' ON-row of Table 324 is the row (row rw_i) of Table 324 that satisfies the following conditions: (1) row_i has one or more SCC_cells in the thermometer-code-ON state; and (2A) row_i is row_0 or (2B) all SCC_cells in the preceding row rw_i−1 are in the thermometer-code-ON state.

Column 5 of Table 324 is specific to the 'last' ON-row and thus considers each SCC_cell in the 'last' ON-row in terms of its thermometer-code-ON state. That is, if SCC_cell in column col_i is in the thermometer-code-ON state, then the binary digit representing col_i in column 5 of Table 324 is set to one (logical high). If the SCC_cell in the row col_i in the thermometer-code-OFF state, then the binary digit representing col_i in column 5 of Table 324 is set to zero (logical low).

Regarding row 1 of Table 324, no SCC_cell (none 206B(i,j), 206D(i,j), 208C(i,j) nor 208E(i,j)) is in the thermometer-code-ON state. For the other rows of Table 324, one or more of SCC_cells 206B(i,j), 206D(i,j), 208C(i,j) or 208E(i,j) are in the thermometer-code-ON state.

For rows 2-9 of Table 324, only row rw_0 of array 204 has any SCC_cell that is in the thermometer-code-ON state. for rows 2—As such, rows 2-9 of Table 324, column 5 of Table 324 is understood as referring to row rw_0 of array 204 as the 'last' ON-row. For rows 2-9 of Table 324, the values of the upper eight bits (column 3) of the example thermometer code are all zero.

Regarding rows 10-17 of Table 324, column 5 of Table 324 is understood as referring to row rw_1 of array 204 as the 'last' ON-row. For each of rows 10-17 of Table 324, the values of the upper eight bits (column 3) of the example thermometer code are 10000000, where the left most binary digit is set to one (logical high).

In column 4 of Table 324, the binary digit representing signal CL(7) is shown as the letter x rather than being set to one (logical high) or zero (logical low). The use of letter x in column 4 of Table 324 is intended to indicate that signal CL(7) is a 'don't care' signal with respect to the operation of decoders 220 and 222, as discussed above.

Figure 4A:
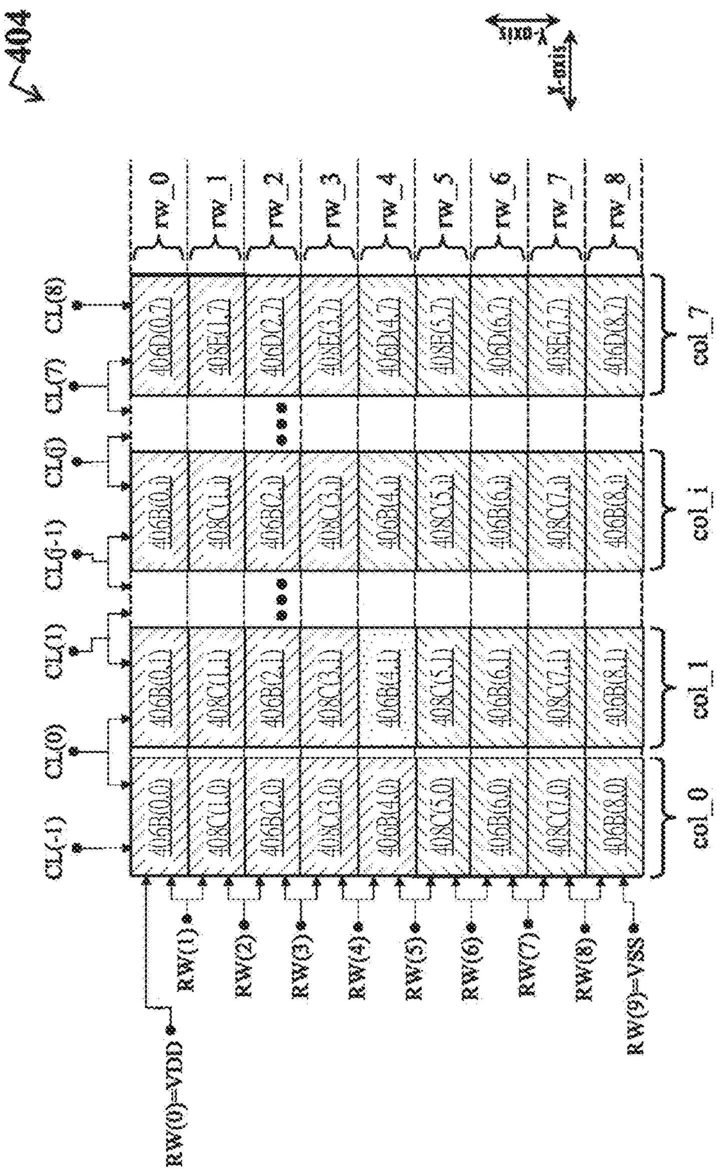
FIGS. 4A-4G are corresponding schematic diagrams, in accordance with some embodiments.
Figure 4A:
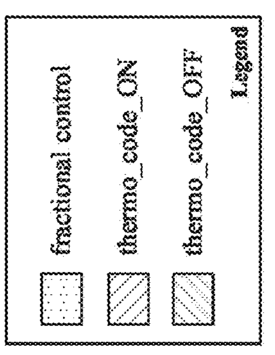

FIG. 4A is a schematic diagram of an array 404, in accordance with some embodiments.

Array 404 of FIG. 4A is similar to array 204 of FIG. 2A. As such, in FIG. 4A, for simplicity of illustration, it is assumed likewise that the number of rows M is M=9 and the number of columns N is N=8. As such, array 404 likewise includes rows rw_0-rw_8 and columns col_0-col_7. In some embodiments, M and N have corresponding values other than M=9 and N=8. For brevity, the discussion will focus on differences of array 404 as compared to array 204 rather than on similarities.

In array 404, even-numbered rows include SCC_cells 406B(i,j) and 406D(i,j). Odd-numbered rows include SCC_cells 408C(i,j) and 408E(i,j), where i is an odd number. For example, even row rw_0 of array 404 includes SCC_cells 406B(0,0)-406B(0,6) and 406D(0,7). For example, odd row rw_1 of array 404 includes SCC_cells 408C(1,0)-408C(1,6) and 408E(1,7).

In array 404, all but one of SCC_cells 406B(i,j), 406D(i,j), 408C(i,j) and 408E(i,j) are controlled according to the binary coupling scheme (see FIG. 2A), whereas all SCC_cells 206B(i,j), 206D(i,j), 208C(i,j) and 208E(i,j) in array 204 of FIG. 2A are controlled according to the binary coupling scheme. In array 404, one of SCC_cells 406B(i,j), 406D(i,j), 408C(i,j) and 408E(i,j) is controlled according to a fractional coupling scheme (discussed below). In some embodiments, array 404 is described as being controlled according to a hybrid binary and fractional coupling scheme.

Figure 4B:
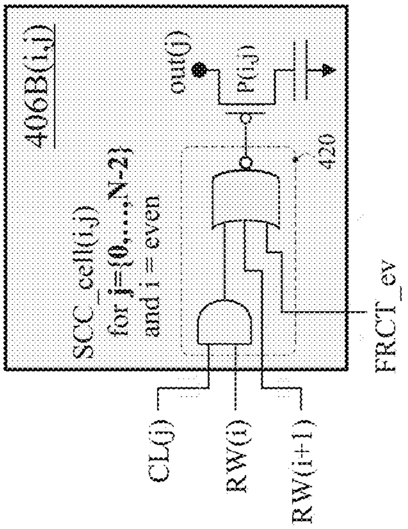
Figure 4C:
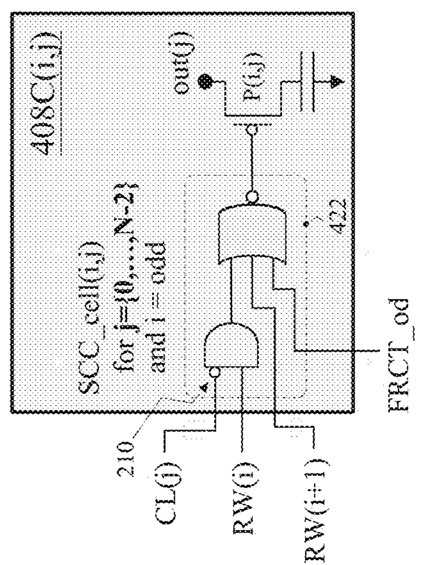
Figure 4D:
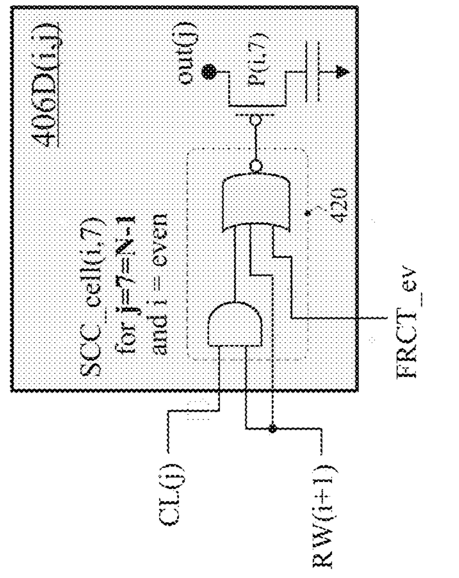
Figure 4E:
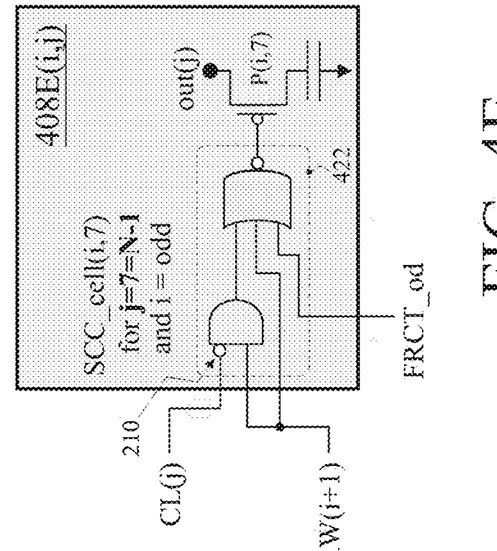

Internal configurations of even-row SCC_cells 406B(i,j) and 406D(i,j) correspondingly are shown in FIGS. 4B and 4D. Internal configurations of odd-row SCC_cells 408C(i,j) and 408E(i,j) correspondingly are shown in FIGS. 4C and 4E.

In FIG. 4A, SCC_cells 406B(i,j), 406D(i,j), 408C(i,j) and 408E(i,j) are controlled via addressing by signals CL(−1), CL(0)-CL(N) and RW(0)-RW(9). A controller (see 112 FIG. 1B) is configured to generate signals CL(−1), CL(0)-CL(N) and RW(0)-RW(9) based on a digital thermometer encoding scheme (see FIG. 5, or the like). Signal CL(−1) represents a signal for an imaginary column col_−1 that precedes col_0. Signal CL(8), i.e., CL(N), represents a signal for an imaginary column col_8.

In FIG. 4A, the digital thermometer code is formed from signals RW(0)-RW(8), CL(−1) and CL(0)-CL(8).

In the example of FIG. 4A, the following is assumed: SCC_cells 406B(i,j), 406D(i,j), 408C(i,j) and 408E(i,j) in a first range from SCC_cell 406B(0,0) to SCC_cell 406B(4,0) are in the thermometer-code-ON state; SCC_cells 406B(i,j), 406D(i,j), 408C(i,j) and 408E(i,j) in a second range from SCC_cell 406B(4,2) (not shown) through SCC_cell 406D(8,7) are assumed to be in the thermometer-code-OFF state; and SCC cell 406B(4,1) is in a fractional state. Accordingly, SCC_cells 406B(i,j), 406D(i,j), 408C(i,j) and 408E(i,j) in the first range are described as being driven according to a duty cycle of 100%. SCC_cells 406B(i,j), 406D(i,j), 408C(i,j) and 408E(i,j) in the second range are described as being driven according to a duty cycle of 0%. In some embodiments, by being in the fractional state, SCC cell 406B(4,1) is understood as being driven according to a partial duty cycle, DCY, in a range 0%<DCY<100%.

In general, the SCC_cell 406B(i,j), 406D(i,j), 408C(i,j) or 408E(i,j) which is in the fractional state is the first SCC_cell 406B(i,j), 406D(i,j), 408C(i,j) or 408E(i,j) that otherwise would be in the thermometer-code-OFF state but for the use of the fractional coupling scheme. In some embodiments, the SCC_cell 406B(i,j), 406D(i,j), 408C(i,j) or 408E(i,j) which is in the fractional state is referred to as the fractionally coupled SCC_cell. In some embodiments, Here, the first SCC_cell 406B(i,j), 406D(i,j), 408C(i,j) or 408E(i,j) that otherwise would be in the thermometer-code-OFF state but for the use of the fractional coupling scheme is referred to as the otherwise-first SCC_cell in the thermometer-code-OFF state.

When each of SCC_cells 406B(i,j), 406D(i,j), 408C(i,j) and 408E(i,j) is in the thermometer-code-ON state, then each of SCC_cells 406B(i,j), 406D(i,j), 408C(i,j) and 408E (i,j) adds one unit of capacitance, CPC, to output node out(j) of corresponding delay stage ds(j). By contrast, when SCC_cell 406B(i,j), 406D(i,j), 408C(i,j) or 408E(i,j) is the fractionally coupled SCC_cell, then the fractionally coupled SCC_cell adds a fraction of one CPC (see FIGS. 4F-4G) to output node out(j) of corresponding delay stage ds(j), where the magnitude of the fraction is proportional to the value of DCY multiplied by CPC such that 0%<DCY*CPC<100%. The use of the fractional coupling scheme for the otherwise-first SCC_cell in the thermometer-code-OFF state, i.e., the use of the hybrid binary and fractional coupling scheme, achieves better/finer granularity as compared to the purely a binary coupling scheme while nevertheless maintaining monotonicity.

In combination with decoders (see FIG. 4B-4D, or the like) correspondingly included in each of SCC_cell 406B(i, j), 406D(i,j), 408C(i,j) and 408E(i,j), the use of signals RW(0)-RW(8) and CL(0)-CL(7) to form the thermometer code reduces the total number of control lines needed for the SA_CDACs corresponding to columns col(0)-col(7) as compared to a CDAC-based delay chain according to another approach. The reduced total number of control lines for the SA_CDACs corresponding to columns col(0)-col(7) results in the corresponding delay chain occupying a smaller area (having a smaller footprint) as compared to the CDAC-based delay chain according to another approach.

FIG. 4B is a schematic diagram of SCC_cell 406B(i,j) for i=even and j={0, . . . , N−2), in accordance with some embodiments.

FIG. 4B extends the example of FIG. 4A. SCC_cell 406B(i,j) is used in even rows of array 404 of FIG. 4A, or the like. Recalling that N=8 in the example of FIG. 4A, SCC_cell 406B(i,j) represents SCC_cells 406B(0,0)-406B (8,6). SCC_cell 406B(i,j) of FIG. 4B is similar to SCC_cell 206B(i,j) of FIG. 2B. For brevity, the discussion will focus on differences of SCC_cell 406B(i,j) as compared to SCC_cell 206B(i,j) rather than on similarities.

SCC_cell 406B(i,j) has four inputs whereas SCC_cell 206B(i,j) has three inputs. As compared to SCC_cell 206B (i,j), the additional fourth input of SCC_cell 406B(i,j) is configured to receive a fractional coupling signal FRCT_ev (see FIG. 4F).

SCC_cell 406B(i,j) includes a decoder 420 whereas SCC_cell 206B(i,j) includes decoder 220. Decoder 420 of SCC_cell 406B(i,j) has four inputs whereas decoder 220 of SCC_cell 206B(i,j) has three inputs. As compared to decoder 220, the additional fourth input of decoder 420 is configured to receive fractional coupling signal FRCT_ev.

FIG. 4C is a schematic diagram of SCC_cell 408C(i,j) for i=odd and j={0, . . . , N−2), in accordance with some embodiments.

FIG. 4C extends the example of FIG. 4A. SCC_cell 408C(i,j) is used in odd rows of array 404 of FIG. 4A, or the like. Recalling that N=8 in the example of FIG. 4A, SCC_cell 408C(i,j) represents SCC_cells 408C(1,0)-408C(7,6).

SCC_cell 408C(i,j) of FIG. 4C is similar to SCC_cell 208C(i,j) of FIG. 2C. For brevity, the discussion will focus on differences of SCC_cell 408C(i,j) as compared to SCC_cell 208C(i,j) rather than on similarities.

SCC_cell 408C(i,j) of FIG. 4C has four inputs whereas SCC_cell 208C(i,j) of FIG. 2C has three inputs. As compared to SCC_cell 208C(i,j), the additional fourth input of SCC_cell 408C(i,j) is configured to receive fractional coupling signal FRCT_od (see FIG. 4G).

SCC_cell 408C(i,j) includes a decoder 422 whereas SCC_cell 208C(i,j) includes decoder 222. Decoder 422 of SCC_cell 408C(i,j) has four inputs whereas decoder 222 of SCC_cell 208C(i,j) has three inputs. As compared to decoder 222, the additional fourth input of decoder 422 is configured to receive fractional coupling signal FRCT_od.

FIG. 4D is a schematic diagram of SCC_cell 406D(i,7) for i=even and j=7, in accordance with some embodiments.

FIG. 4D extends the example of FIG. 4A. SCC_cell 406D(i,7) is used in even rows of the last column col_N−1 of the array, i.e., col_7 in the context of array 404 of FIG. 4A, or the like. SCC_cell 406D(i,7) of FIG. 4D is similar to SCC_cell 206D(i,j) of FIG. 2D. For brevity, the discussion will focus on differences of SCC_cell 406D(i,7) of FIG. 4D as compared to SCC_cell 206D(i,j) of FIG. 2D rather than on similarities.

SCC_cell 406D(i,j) of FIG. 4D has four inputs whereas SCC_cell 206D(i,j) of FIG. 2D has three inputs. As compared to SCC_cell 206D(i,j), the additional fourth input of SCC_cell 406D(i,j) is configured to receive a fractional coupling signal FRCT_ev (see FIG. 4F).

SCC_cell 406D(i,j) includes a decoder 420 whereas SCC_cell 206D(i,j) includes decoder 220. Decoder 420 of SCC_cell 406D(i,j) has four inputs whereas decoder 220 of SCC_cell 206D(i,j) has three inputs. As compared to decoder 220, the additional fourth input of decoder 420 is configured to receive fractional coupling signal FRCT_ev.

FIG. 4E is a schematic diagram of SCC_cell 408E(i,j) for i=odd and j=7, in accordance with some embodiments.

FIG. 4E extends the example of FIG. 4A. SCC_cell 408E(i,j) is used in odd rows of the last column col_N−1 of the array, i.e., col_7 in the context of array 404 of FIG. 4A, or the like. SCC_cell 408E(i,j) of FIG. 4E is similar to SCC_cell 208E(i,j) of FIG. 2E. For brevity, the discussion will focus on differences of SCC_cell 408E(i,j) of FIG. 4E as compared to SCC_cell 208E(i,j) of FIG. 2E. rather than on similarities.

SCC_cell 406E(i,j) of FIG. 4E has four inputs whereas SCC_cell 206E(i,j) of FIG. 2E has three inputs. As compared to SCC_cell 206E(i,j), the additional fourth input of SCC_cell 406E(i,j) is configured to receive a fractional coupling signal FRCT_od (see FIG. 4G).

SCC_cell 406E(i,j) includes a decoder 422 whereas SCC_cell 206E(i,j) includes decoder 222. Decoder 422 of SCC_cell 406E(i,j) has four inputs whereas decoder 222 of SCC_cell 206E(i,j) has three inputs. As compared to decoder 222, the additional fourth input of decoder 422 is configured to receive fractional coupling signal FRCT_od.

Figure 4F:
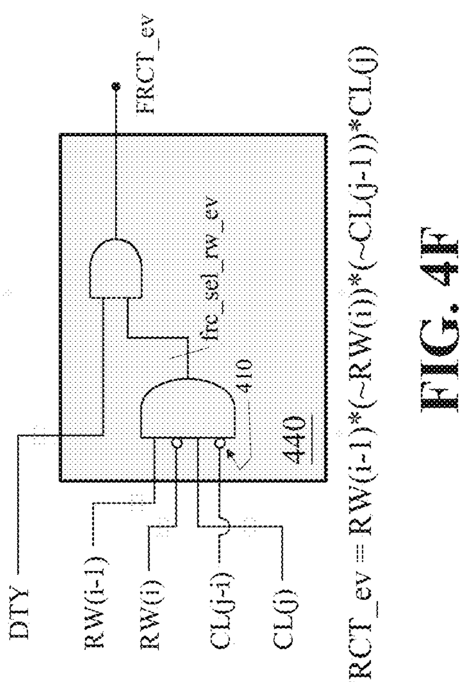

FIG. 4F is a schematic diagram of a selector 440, in accordance with some embodiments.

FIG. 4F extends the example of FIG. 4A. Selector 440 is used for even rows of array 404 of FIG. 4A, or the like. Selector 440 is configured to generate fractional coupling signal FRCT_ev (see FIGS. 4B and 4D) and thereby drive the otherwise-first SCC_cell in the thermometer-code-OFF state.

Selector 440 includes a four-input AND gate 410 and a two-input AND gate 444. AND gate 410 has two non-inverted inputs and two inverted inputs. The two inverted inputs are indicated by prefixed inversion bubbles 410, only one of which is called out with reference number 410 for simplicity of illustration. In some embodiments, the inverted inputs are described as being active low inputs.

A first one of the two non-inverted inputs of AND gate 442 is configured to receive row-addressing signal RW(i−1). A second one of the two non-inverted inputs of AND gate 442 is configured to receive column-addressing signal CL(j). A first one of the two inverted inputs of AND gate 442 is configured to receive row-addressing signal RW(i). A second one of the two inverted inputs of AND gate 442 is configured to receive column-addressing signal CL(j−1). AND gate 442 is configured to generate an even-row fractional selection signal frc_sel_rw_ev (discussed below).

Regarding AND gate 444, a first one of the inputs of AND gate 444 is configured to receive a duty signal DTY. In some embodiments, duty signal DTY is a pulse width modulation (PWM) signal with a constant pulse width or a randomized pulse width. In some embodiments, PWM is described as pulse-duration modulation (PDM) or pulse-length modulation (PLM). Duty signal DTY is configured with a waveform that represents the partial duty cycle, DCY, in the range 0%<DCY<100%.

A second one of the inputs of AND gate 444 is configured to receive even-row fractional selection signal frc_sel_rw_ev from AND gate 442. AND gate 444 is configured to generate fractional coupling signal FRCT_ev.

Even-row fractional selection signal frc_sel_rw_ev is used to select the otherwise-first SCC_cell in the thermometer-code-OFF state, where the latter is to be driven by duty signal DTY. A truth table for fractional control signal FRCT_ev is shown below in part as Table 3.

In some embodiments, the combinatorial logic of selector 440 is described as follows. For i=even, set frc_sel_rw_ev=1 when RW(i−1)=1, RW(i)=0, CL(j−1)=0 and CL(j)=1. More particularly, for i=even, set frc_sel_rw_ev=RW(i−1)*(~RW(i))*(~CL(j−1))*CL(j) and set FRCT_ev=DTY*frc_sel_rw_ev, where (~RW(i)) and (~CL(j−1)) correspondingly are the inverses of RW(i) and CL(j−1).

Figure 4G:
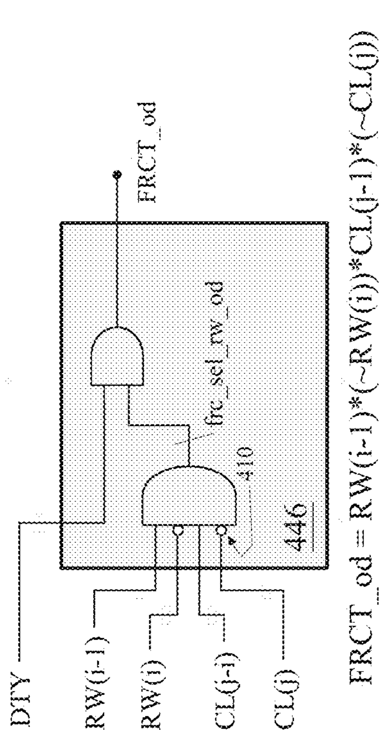

FIG. 4G is a schematic diagram of a selector 446, in accordance with some embodiments.

FIG. 4G extends the example of FIG. 4A. Selector 446 is used for odd rows of array 404 of FIG. 4A, or the like. Selector 446 is configured to generate fractional coupling signal FRCT_od (see FIGS. 4C and 4E) and thereby drive the otherwise-first SCC_cell in the thermometer-code-OFF state.

Selector 446 of FIG. 4G is similar to selector 440 of FIG. 4F. For brevity, the discussion will focus on differences of selector 446 of FIG. 4G as compared to selector 440 of FIG. 4F rather than on similarities.

Regarding selector 446, the second non-inverted input and the second inverted input of AND gate 442 of selector 446 are configured differently as compared to the second non-inverted input and the second inverted input of AND gate 442 of selector 440.

The second non-inverted input of AND gate 442 of selector 446 is configured to receive column-addressing signal CL(j−1) rather than signal CL(j) as in selector 440. A second inverted input of AND gate 442 of selector 446 is configured to receive column-addressing signal CL(j) rather than signal CL(j−1) as in selector 440. A truth table for fractional control signal FRCT_od is shown in part below as Table 3.

In some embodiments, the combinatorial logic of selector 446 is described as follows. For i=odd, set frc_sel_rw_od=1 when RW(i−1)=1, RW(i)=0, CL(j−1)=1 and CL(j)=0. More particularly, for i=odd, set frc_sel_rw_od=RW(i−1)*(~RW(i))*CL(j−1)*(~CL(j)) and set FRCT_od=DTY*frc_sel_rw_od, where (~CL(j)) is the inverse of CL(j).

The truth table for fractional control signals FRCT_ev and FRCT_od is shown below as Table 3.

TABLE 3

(signals FRCT_ev and FRCT_od)

| Row # parity | RW(i − 1) | RW(i) | CL(j − 1) | CL(j) | FRCT_ev | FRCT_od |
|---|---|---|---|---|---|---|
| EVEN | 1 | 0 | 0 | 1 | 1 | n/a |
| ODD | 1 | 0 | 1 | 0 | n/a | 1 |

For all permutations and combinations of signals CL(j−1), CL(j), RW(i−1) and RW(i) other than those shown above in Table 3, FRCT_ev=0 and FRCT_od=0.

FIG. 5 is a table 548 showing partial values of a thermometer code, in accordance with some embodiments.

The table of FIG. 5 extends the example of FIG. 4A. As columns col_0-col_7 of array 404 of FIG. 4A represent corresponding SC_CDACs, Table 548 provides examples of how a thermometer code is used to adjust each of the SA_CDACs separately relative to the other SA_CDACs.

Table 548 includes: a first column (column 1) that shows the row-numbers assigned to the rows in Table 548; a second column (column 2) that shows signals RW(0)-RW(7) as corresponding binary digits concatenated to form the upper eight bits of the example thermometer code; a third column (column 3) that shows signal (CL(0) as a binary digit which forms the middle binary digit of the example thermometer code; a fourth column (column 4) that shows signals CL(1)-CL(7) as corresponding binary digits concatenated to form the lower seven bits of the example thermometer code; a fifth column (column 5) which shows signal CL(8) as a binary digit, where signal CL(8) corresponds to an imaginary column col_8; and a sixth column (column 6) that shows which of columns col_0-col_7 corresponding has an SCC_cell 406B(i,j), 406D(i,j), 408C(i,j) or 408E(i,j) in the fractional state. In column 6 of Table 548, the binary digit have the larger font represents the column which has SCC_cell 406B(i,j), 406D(i,j), 408C(i,j) or 408E(i,j) in the fractional state.

The full example code represented by Table 548 is formed by concatenating signals RW(0)-RW(7) and CL(0)-CL(7) as corresponding binary digits representing the upper eight bits and lower eight bits of the example thermometer code in the context of the example of FIG. 4A. Table 548 is a partial listing of the permutations and combinations of values for the example thermometer code in the context of the example of FIG. 4A.

Column 2 of Table 548 is similar to column 3 of Table 324. Together, columns 3 and 4 of Table 548 are similar to column 4 of Table 324.

In row 12 of Table 548, for example, the value of the thermometer code is 1000 0000 0 000 001, which represents a base 10 value of 11.4375. The base 2 equivalent of 11.4375 (base 10) includes a base 2 integer portion of 0000 1011 and base 2 fractional portion of 0111.

Figure 6:
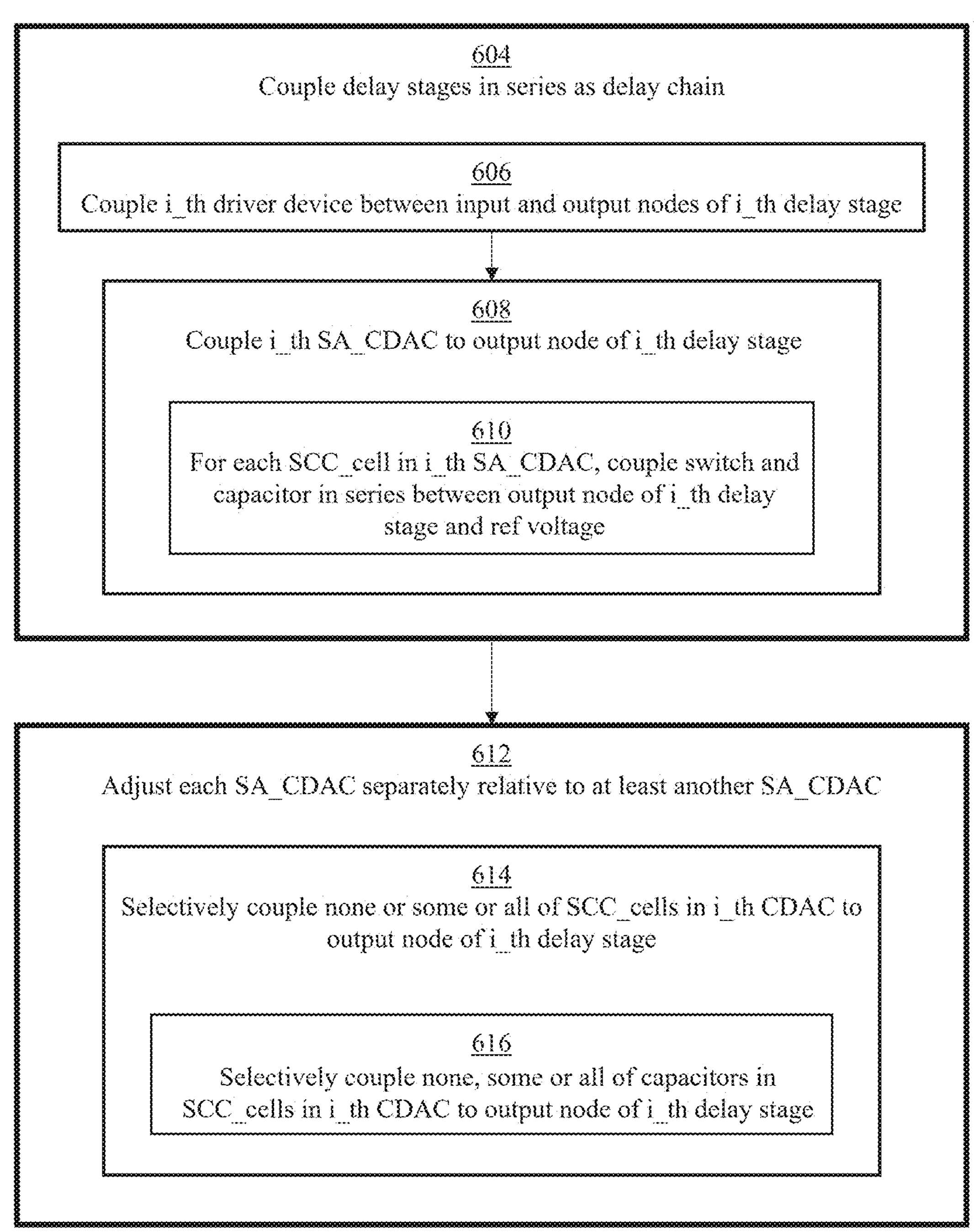
FIGS. 6-7 are flowcharts of corresponding methods, in accordance with some embodiments.

FIG. 6 is a flowchart of method 600, in accordance with some embodiments.

Method 600 is an example of a method by which SA_CDACs, e.g., SA_CDAC(0)-SA_CDAC(N−1) of FIG. 1A, the SA_DCACs corresponding to array 204 of FIG. 2A, the SA_DCACs corresponding to array 404 of FIG. 4A, or the like, are operated. Method 600 includes blocks 604-616. Flow according to method 600 begins at block 604.

At block 604, delay stages are coupled in series as a delay chain. An example of the delay chain is delay chain 102 of FIG. 1A, or the like. Examples of the delay stages are delay stages ds(0)-ds(N−1) of FIG. 1A, or the like. Within block 604, flow proceeds to block 606.

At block 606, for each delay stage, an i_th driver device is coupled between input and output nodes of the i_th delay stage. Examples of the i_th driver device includes driver devices drv(0)-drv(N−1) of FIG. 1A, or the like. Examples of the input nodes include input nodes in (0)-in (N−1) correspondingly of driver devices drv(0)-drv(N−1) of FIG. 1A, or the like. Examples of the output nodes include output nodes out(0)-out(N−1) correspondingly of driver devices drv(0)-drv(N−1) of FIG. 1A, or the like. From block 606, flow proceeds to block 608.

At block 608, for each delay stage, the i_th SC_CDAC is coupled to the i_the output node of the i_th delay stage. Examples of the i_th SC_CDAC coupled to the i_the output node of the i_th delay stage include SC_DAC(0)-SC_CDAC (N−1) correspondingly coupled to output nodes out(0)-out (N−1) of delay stages ds(0)-ds(N−1) of FIG. 1A, or the like. Within block 608, flow proceeds to block 610.

At block 610, for each SCC_cell in the i_th SA-CDAC, the corresponding switch and the corresponding capacitor are coupled in series between the output node of the i_th delay stage and a first reference voltage. An example of the first reference voltage is VSS as in FIG. 2B-2E, 4B-4E, or the like. Examples of the output nodes include, again, output nodes out(0)-out(N−1) correspondingly of driver devices drv(0)-drv(N−1) of FIG. 1A, or the like. Examples of the SCC_cell includes SCC_cells 206B(i,j), 206D(i,j), 208C(i, j), 208E(i,j), 406B(i,j), 406D(i,j), 408C(i,j) and 408E(i,j), or the like. Examples of the corresponding switch include switches P(i,j) of SCC_cells 206B(i,j), 208C(i,j), 406B(i,j) and 408C(i,j), P(i,7) of SCC_cells 206D(i,j), 208E(i,j), 406D(i,j) and 408E(i,j), or the like. Examples of the corresponding capacitors include the capacitor in each of SCC_cells 206B(i,j), 206D(i,j), 208C(i,j), 208E(i,j), 406B(i,j), 406D(i,j), 408C(i,j) and 408E(i,j), or the like. From block 610, flow proceeds to exit block 608. From block 608, flow proceeds to exit block 604. From block 604, flow proceeds to block 612.

At block 612, each SA_CDAC is adjusted separately relative to another SA_CDAC. Examples of adjusting each SA_CDAC separately relative to other SA_CDACs include the examples of Table 324 of FIG. 3, Table 548 of FIG. 5, or the like. In some embodiments, at least one but fewer than all of the SA_CDACs are a type of CDAC this is not separately adjustable. Within block 612, flow proceeds to block 614.

At block 614, for each delay stage, none or some or all of the SCC_cells are selectively coupled to the output node of the i_th delay stage. Examples of none or some or all of the SCC_cells being selectively coupled to the output node of the i_th delay stage include the examples of Table 324 of FIG. 3, Table 548 of FIG. 5, or the like. Within block 614, flow proceeds to block 616.

At block 616, for the SCC_cells in each delay stage, none or some or all of the capacitors in the SCC_cells are selectively coupled to the output node of the i_th delay stage. Examples of none or some or all of capacitors of the SCC_cells being selectively coupled to the output node of the i_th delay stage include the examples of Table 324 of FIG. 3, Table 548 of FIG. 5, or the like.

In some embodiments, method 600 further includes controlling the delay chain to function as a controllable delay line including: receiving a clock signal at the input node of the first delay stage; and propagating the clock signal serially through the delay chain such that a signal on the output node of the last delay stage represents a delayed version of the clock signal. An example of the clock signal is clock signal CLK of FIG. 1D, or the like. An example of the delayed version of the clock signal includes signal CLK_dlyd of FIG. 1D which represents a delay version of signal CLK, or the like.

In some embodiments, method 600 further includes controlling the delay chain to function as a controllable oscillator including: feedback-coupling the output node of the last delay stage to the input node of the first delay stage. An example of the controllable oscillator is oscillator 114 of FIG. 1C, or the like. An example of feedback-coupling the output node of the last delay stage to the input node of the first delay stage includes feedback coupling 116 of FIG. 1C, or the like.

Figure 7:
Figure 7:
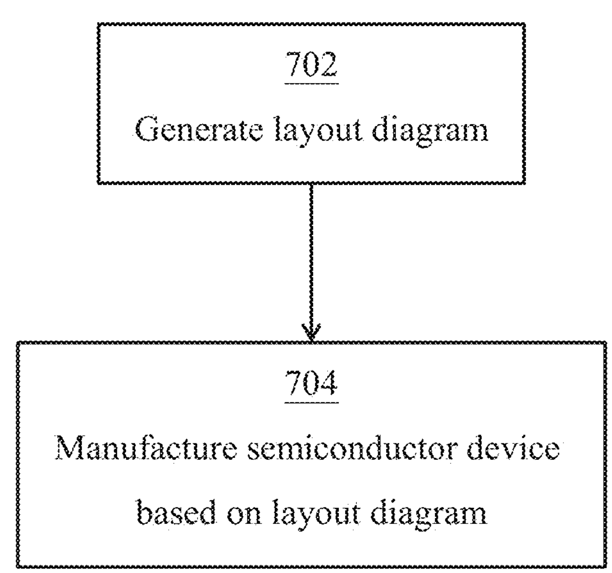

FIG. 7 is a flowchart (flow diagram) of a method 700 of manufacturing a system or device, in accordance with some embodiments.

Method 700 is implementable, for example, using EDA system 800 (FIG. 8, discussed below) and an IC manufacturing system 900 (FIG. 9, discussed below), in accordance with some embodiments. Examples of a system or device which can be manufactured according to method 700 include the systems or devices disclosed herein, or the like.

In FIG. 7, the method of flowchart 700 includes blocks 702-704. At block 702, a layout diagram is generated which, among other things, includes one or more layout diagrams corresponding to one or more of the systems or devices disclosed herein, or the like. Block 702 is implementable, for example, using EDA system 800 (FIG. 8, discussed below), in accordance with some embodiments. From block 702, flow proceeds to block 704.

At block 704, based on the layout diagram, at least one of (A) one or more photolithographic exposures are made or (b) one or more photolithography masks are fabricated or (C) one or more components in a layer of a device, e.g., a device is fabricated. Sec discussion below of IC manufacturing system 900 in FIG. 9 below.

Figure 8:
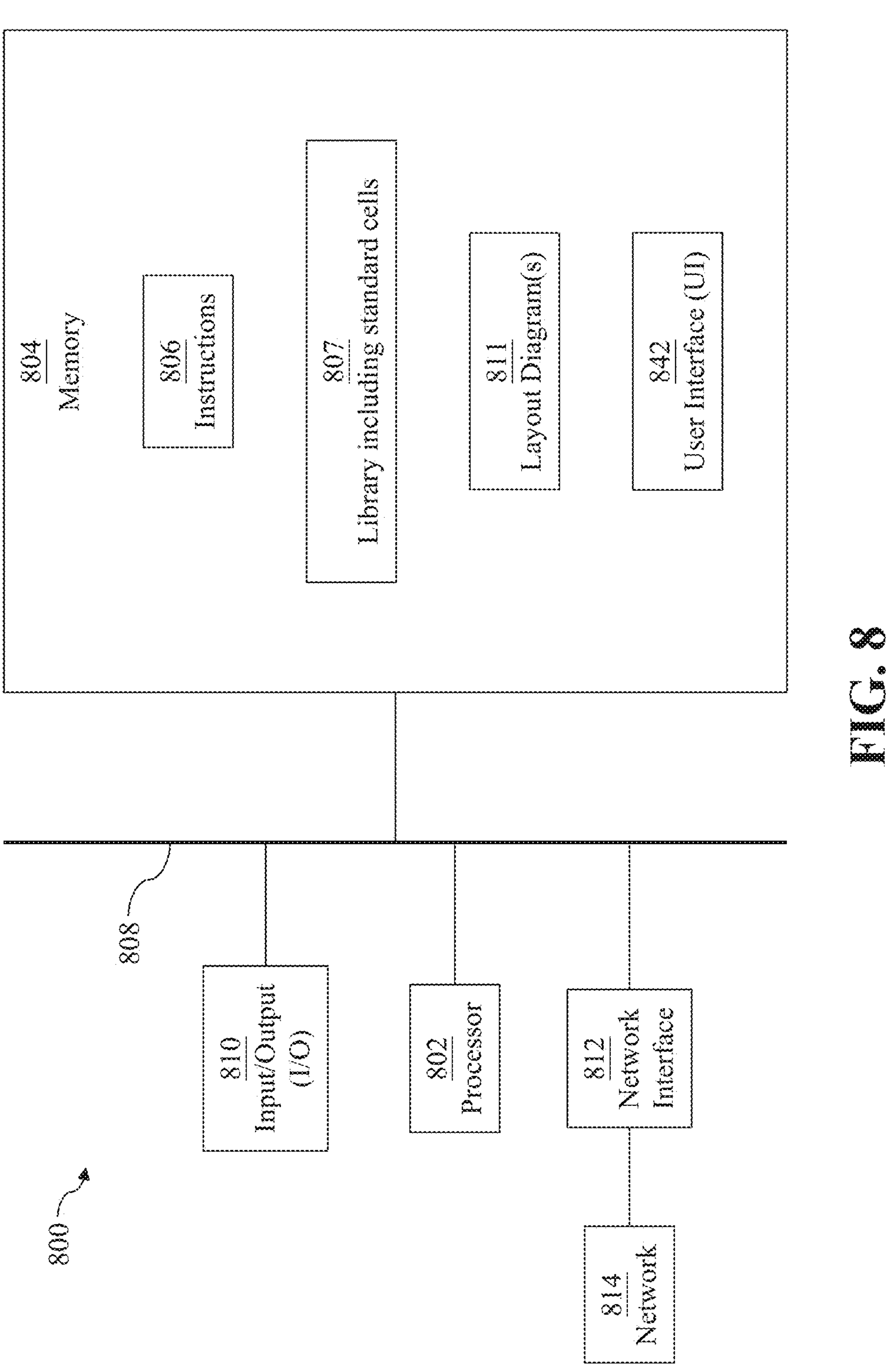
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., methods of generating corresponding to the systems or devices disclosed herein, or the like, in accordance with one or more embodiments (hereinafter, the noted processes and/or methods).

Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause EDA system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause EDA system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows EDA system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 800.

EDA system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
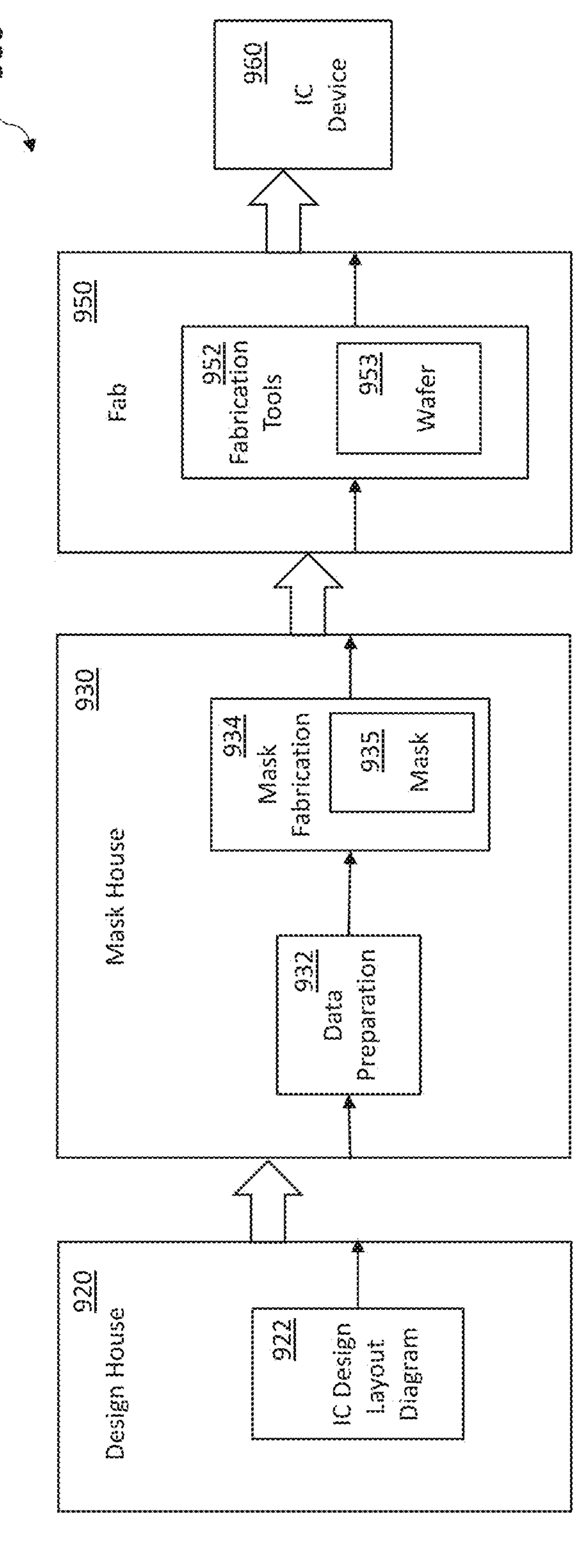
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

In some embodiments, based on the layout diagram generated by block 602 of FIG. 6, the IC manufacturing system 900 implements block 704 of FIG. 7 wherein at least one of (A) one or more semiconductor masks or (B) at least one component in a layer of an inchoate semiconductor integrated circuit is fabricated using manufacturing system 900. In some embodiments, the IC manufacturing system 900 implements the flowcharts of FIGS. 7A-7B.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate terminal, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a delay chain includes: delay stages coupled in series, each delay stage including: a driver device coupled between an input node and an output node of the delay stage; and a capacitor digital-to-analog converter (CDAC) coupled to the output node of the delay stage; at least one of the CDACs being a separately adjustable (SA) type of CDAC (SA_CDAC) that is separately adjustable relative to at least another one of the CDACs; and a controller configured to adjust the at least one CDAC.

In some embodiments, the delay chain further includes: the delay stages include a first delay stage and a last delay stage; and the delay chain is configured as a controllable delay line such that: the first delay stage is configured to receive a clock signal at the input node thereof; and the last delay stage is configured to generate a delayed version of the clock signal at the output node thereof.

In some embodiments, the delay stages include a first delay stage and a last delay stage; and the delay chain is configured as a controllable oscillator such that: at the input node of the first delay stage, the first delay stage is configured to receive a signal fed back from the output node of the last delay stage.

In some embodiments, each of the CDACs is an SA_CDAC; and the controller is further configured to adjust correspondingly each of the SA_CDACs.

In some embodiments, the at least one SA_CDAC is a one-dimensional array of separately controllable capacitance (SCC) cells (SCC_cells), each SCC_cell being separately controllable to be coupled to the output node of the corresponding delay stage relative to other ones of the SCC_cells, the one-dimensional array including rows and a single column, and each row including a single SCC_cell; and the controller is further configured to selectively couple none or some or all of the SCC_cells in the at least one SA_CDAC to the output node of the corresponding delay stage.

In some embodiments, for each of the at least one SA_CDAC, each SCC_cell includes: a switch and a capacitor coupled in series between the output node of the corresponding delay stage and a first reference voltage; and a decoder configured to receive corresponding addressing signals and generate a switch-state control signal to control the switch to be in an open state or a closed state.

In some embodiments, the decoders have corresponding row-number-parity-specific configurations such that the decoders in odd rows or even rows have a first configuration and conversely the decoders in even rows or odd rows have a second configuration different than the first configuration.

In some embodiments, each of the CDACs is an SA_CDAC; a count of the delay stages is M, where M is an integer and 2≤M, such that a count of the one-dimensional arrays is M; a count of the rows in each of the one-dimensional arrays including of SCC_cells is N, where N is an integer and 2≤N; together the one-dimensional arrays including SCC_cells represent an N×M array of SCC_cells; and the controller is further configured to adjust correspondingly each of the SA_CDACs according to a thermometer encoding scheme for the N×M array; and for each of the SA_CDACs, the controller is further configured to generate the addressing signals according to the thermometer encoding scheme such that correspondingly resultant switch-state control signals control none or some or all of the capacitors in the corresponding one-dimensional arrays to be selectively coupled to the output node of the corresponding delay stage.

In some embodiments, the delay chain further includes: for each SCC_cell that is in a thermometer-code-ON state according to the thermometer encoding scheme, the controller is further configured to generate the addressing signals such that a correspondingly resultant switch-state control signal controls the corresponding switch to be in the closed state according to a first duty cycle (DCY_1) of 100% such that DCY_1=100%; and for a selected SCC_cell that otherwise would be in a thermometer-code-OFF state according to the thermometer encoding scheme, the controller is further configured to generate the addressing signals such that a correspondingly resultant switch-state control signal controls the corresponding switch to be in the closed state according to a second duty cycle (DCY_2) in a range 0%<DCY_2<100%.

In some embodiments, a method (of operating a delay chain) includes: coupling delay stages in series as representing the delay chain, the coupling delay stages including, for each of the delay stages, the following: coupling a driver device between an input node and an output node of the delay stage; and coupling a capacitor digital-to-analog converter (CDAC) to the output node of the delay stage wherein for at least one of the delay stages, the corresponding CDAC being a separately adjustable (SA) type of CDAC (SA_CDAC) that is separately adjustable relative to the CDAC of at least another one of the CDACs; and adjusting at least one CDAC separately relative to at least another one of the delay stages; and adjusting at least one CDAC separately relative to at least another one of the CDACs.

In some embodiments, each of the CDACs is an SA_CDAC; and the method includes adjusting correspondingly each of the SA_CDACs.

In some embodiments, the at least one SA_CDAC is a one-dimensional array of separately controllable capacitance (SCC) cells (SCC_cells), each SCC_cell being separately controllable to be coupled to the output node of the corresponding delay stage relative to other ones of the SCC_cells, the one-dimensional array including rows and a single column, and each row including a single SCC_cell; and the method further includes: selectively coupling none or some or all of the SCC_cells in the at least one SA_CDAC to the output node of the corresponding delay stage.

In some embodiments, for each of the at least one SA_CDAC, each SCC_cell includes a switch and a capacitor; and the method further includes, for each SCC_cell, the following: coupling the switch and the capacitor in series between the output node of the corresponding delay stage and a first reference voltage; generating a switch-state control signal to control the switch to be in an open state or a closed state based on corresponding addressing signals.

In some embodiments, the generating a switch-state control signal includes: before the generating a switch-state control signal, performing row-number-parity-specific manipulation of the corresponding addressing signals.

In some embodiments, the performing row-number-parity-specific manipulation includes: in even rows or odd rows, inverting at least one of the addressing signals before the generating a switch-state control signal; and, in odd rows or even rows, conversely not inverting any of the addressing signals before the generating a switch-state control signal.

In some embodiments, the generating a switch-state control signal includes: performing a logical AND-OR-INVERT (AOI) operation on the corresponding addressing signals.

In some embodiments, each of the CDACs is an SA_CDAC; a count of the delay stages is M, where M is an integer and 2≤M, such that a count of the one-dimensional arrays is M; a count of the rows in each of the one-dimensional arrays including SCC_cells is N, where N is an integer and 2≤N; together the one-dimensional arrays including SCC_cells represent an N×M array of SCC_cells; and the method further includes adjusting correspondingly each of the SA_CDACs according to a thermometer encoding scheme for the N×M array including: generating the addressing signals according to the thermometer encoding scheme such correspondingly resultant switch-state control signals control that none or some or all of the capacitors in the corresponding one-dimensional arrays are selectively coupled to the output node of the corresponding delay stage.

In some embodiments, for each SCC_cell that is in a thermometer-code-ON state according to the thermometer encoding scheme, the generating the addressing signals includes configuring the addressing signals such that a correspondingly resultant switch-state control signal controls the corresponding switch to be in the closed state according to a first duty cycle (DCY_1) of 100% such that DCY_1=100%; and for a selected SCC_cell that otherwise would be in a thermometer-code-OFF state according to the thermometer encoding scheme, the generating the addressing signals includes configuring the addressing signals such that a correspondingly resultant switch-state control signal controls the corresponding switch to be in the closed state according to a second duty cycle (DCY_2) in a range 0%<DCY_2<100%.

In some embodiments, a delay chain includes: delay stages coupled in series, each delay stage including a driver device coupled between an input node and an output node of the delay stage, and a capacitor digital-to-analog converter (CDAC) coupled to the output node of the delay stage; at least one of the CDACs being a separately adjustable (SA) type of CDAC (SA_CDAC) that is separately adjustable relative to at least another one of the CDACs; the at least one SA_CDAC being a one-dimensional array of separately controllable capacitance (SCC) cells (SCC_cells), each SCC_cell being separately controllable to be coupled to the output node of the corresponding delay stage relative to other ones of the SCC_cells, the one-dimensional array including rows and a single column, and each row including a single SCC_cell; and a controller configured to adjust the at least one CDAC by selectively coupling none or some or all of the SCC_cells in the at least one SA_CDAC to the output node of the corresponding delay stage.

In some embodiments, for each of the at least one SA_CDAC, each SCC_cell includes: a switch and a capacitor coupled in series between the output node of the corresponding delay stage and a first reference voltage; and a decoder configured to receive corresponding addressing signals and generate a switch-state control signal to control the switch to be in an open state or a closed state.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A delay chain comprising:
delay stages coupled in series, each delay stage including:
a driver device coupled between an input node and an output node of the delay stage; and
a capacitor digital-to-analog converter (CDAC) coupled to the output node of the delay stage;
at least one of the CDACs being a separately adjustable (SA) type of CDAC (SA_CDAC) that is separately adjustable relative to at least another one of the CDACs; and
a controller configured to adjust the at least one CDAC; and
wherein the at least one SA_CDAC is a one-dimensional array of separately controllable capacitance (SCC) cells (SCC_cells), the one-dimensional array including rows and a single column, and each of the rows including a corresponding single one the SCC_cells;
wherein each SCC_cell is separately controllable to be coupled to the output node of the corresponding delay stage relative to other ones of the SCC_cells; and
the controller is further configured to selectively couple none or some or all of the SCC_cells in the at least one SA_CDAC to the output node of the corresponding delay stage.

2. The delay chain of claim 1, wherein:
the delay stages include a first delay stage and a last delay stage; and
the delay chain is configured as a controllable delay line such that:
the first delay stage is configured to receive a clock signal at the input node thereof; and
the last delay stage is configured to generate a delayed version of the clock signal at the output node thereof.

3. The delay chain of claim 1, wherein:
the delay stages include a first delay stage and a last delay stage; and
the delay chain is configured as a controllable oscillator such that:
at the input node of the first delay stage, the first delay stage is configured to receive a signal fed back from the output node of the last delay stage.

4. The delay chain of claim 1, wherein:
each of the CDACs is an SA_CDAC; and
the controller is further configured to adjust correspondingly each of the SA_CDACs.

5. The delay chain of claim 1, wherein:
for each of the at least one SA_CDAC, each SCC_cell includes:
a switch and a capacitor coupled in series between the output node of the corresponding delay stage and a first reference voltage; and
a decoder configured to receive corresponding addressing signals and generate a switch-state control signal to control the switch to be in an open state or a closed state.

6. The delay chain of claim 5, wherein:
the decoders have corresponding row-number-parity-specific configurations such that the decoders in odd rows or even rows have a first configuration and conversely the decoders in even rows or odd rows have a second configuration different than the first configuration.

7. The delay chain of claim 5, wherein:
each of the CDACs is an SA_CDAC;
a count of the delay stages is M, where M is an integer and $2 \leq M$, such that a count of the one-dimensional arrays is M;
a count of the rows in each of the one-dimensional arrays including SCC_cells is N, where N is an integer and $2 \leq N$;
together the one-dimensional arrays including SCC_cells represent an N×M array of SCC_cells; and
the controller is further configured to adjust correspondingly each of the SA_CDACs according to a thermometer encoding scheme for the N×M array; and
for each of the SA_CDACs,
the controller is further configured to generate the addressing signals according to the thermometer encoding scheme such that correspondingly resultant switch-state control signals control none or some or all of the capacitors in the corresponding one-dimensional arrays to be selectively coupled to the output node of the corresponding delay stage.

8. The delay chain of claim 7, wherein:

for each SCC_cell that is in a thermometer-code-ON state according to the thermometer encoding scheme, the controller is further configured to generate the addressing signals such that a correspondingly resultant switch-state control signal controls the corresponding switch to be in the closed state according to a first duty cycle (DCY_1) of 100% such that DCY_1=100%; and for a selected SCC_cell that otherwise would be in a thermometer-code-OFF state according to the thermometer encoding scheme, the controller is further configured to generate the addressing signals such that a correspondingly resultant switch-state control signal controls the corresponding switch to be in the closed state according to a second duty cycle (DCY_2) in a range 0%<DCY_2<100%.

9. The delay chain of claim 5, wherein:

each decoder includes an AND-OR-INVERT (AOI) gate configured to generate the corresponding switch-state control signal and to have input terminals configured to receive the corresponding addressing signals.

10. The delay chain of claim 9, wherein:

the AOI gates have corresponding row-number-parity-specific configurations including:

for odd rows or even rows, a first configuration in which a first input terminal is an active low type of input or an active high type of input; and conversely for even rows or odd rows, a second configuration in which the first input terminal is the active high type of input or the active low type of input.

11. A method of operating a delay chain, the method comprising:

coupling delay stages in series as representing the delay chain, for each of the delay stages, the coupling the delay stages including:

coupling a driver device between an input node and an output node of the delay stage; and coupling a capacitor digital-to-analog converter (CDAC) to the output node of the delay stage, wherein, for at least one of the delay stages, the corresponding CDAC being a separately adjustable (SA) type of CDAC (SA_CDAC) that is separately adjustable relative to the CDAC of at least another one of the delay stages, each of the at least one SA_CDAC being a one-dimensional array of separately controllable capacitance (SCC) cells (SCC_cells), the one-dimensional array including rows and a single column, and each of the rows including a corresponding single one the SCC_cells, and each of the SCC_cells being separately controllable to be coupled to the output node of the corresponding delay stage relative to other ones of the SCC_cells;

adjusting at least one CDAC separately relative to at least another one of the CDACs; and selectively coupling none or some or all of the SCC_cells in the at least one SA_CDAC to the output node of the corresponding delay stage.

12. The method of claim 11, wherein:

each of the CDACs is an SA_CDAC; and the method further comprises:

adjusting correspondingly each of the SA_CDACs.

13. The method of claim 11, wherein:

for each of the at least one SA_CDAC, each SCC_cell includes a switch and a capacitor; and for each SCC_cell, the method further comprises:

coupling the switch and the capacitor in series between the output node of the corresponding delay stage and a first reference voltage; and generating a switch-state control signal to control the switch to be in an open state or a closed state based on corresponding addressing signals.

14. The method of claim 13, wherein:

the generating a switch-state control signal includes:

before the generating a switch-state control signal, performing row-number-parity-specific manipulation of the corresponding addressing signals.

15. The method of claim 14, wherein:

the performing row-number-parity-specific manipulation includes:

in even rows or odd rows, inverting at least one of the addressing signals before the generating a switch-state control signal; and in odd rows or even rows, conversely not inverting any of the addressing signals before the generating a switch-state control signal.

16. The method of claim 13, wherein:

the generating a switch-state control signal includes:

performing a logical AND-OR-INVERT (AOI) operation on the corresponding addressing signals.

17. The method of claim 13, wherein:

each of the CDACs is an SA_CDAC;

a count of the delay stages is M, where M is an integer and 2≤M, such that a count of the one-dimensional arrays is M;

a count of the rows in each of the one-dimensional arrays including SCC_cells is N, where N is an integer and 2≤N;

together the one-dimensional arrays including SCC_cells represent an N×M array of SCC_cells; and the method further comprises:

adjusting correspondingly each of the SA_CDACs according to a thermometer encoding scheme for the N×M array including:

generating the addressing signals according to the thermometer encoding scheme such that correspondingly resultant switch-state control signals control that none or some or all of the capacitors in the corresponding one-dimensional arrays are selectively coupled to the output node of the corresponding delay stage.

18. The method of claim 17, wherein:

for each SCC_cell that is in a thermometer-code-ON state according to the thermometer encoding scheme, the generating the addressing signals includes:

configuring the addressing signals such that a correspondingly resultant switch-state control signal controls the corresponding switch to be in the closed state according to a first duty cycle (DCY_1) of 100% such that DCY_1=100%; and for a selected SCC_cell that otherwise would be in a thermometer-code-OFF state according to the thermometer encoding scheme, the generating the addressing signals includes:

configuring the addressing signals such that a correspondingly resultant switch-state control signal controls the corresponding switch to be in the closed state according to a second duty cycle (DCY_2) in a range 0%<DCY_2<100%.

19. A delay chain comprising:

delay stages coupled in series, each delay stage including:

a driver device coupled between an input node and an output node of the delay stage; and a capacitor digital-to-analog converter (CDAC) coupled to the output node of the delay stage;

at least one of the CDACs being a separately adjustable (SA) type of CDAC (SA_CDAC) that is separately adjustable relative to at least another one of the CDACs;

the at least one SA_CDAC being a one-dimensional array of separately controllable capacitance (SCC) cells (SCC_cells), each SCC_cell being separately controllable to be coupled to the output node of the corresponding delay stage relative to other ones of the SCC_cells, the one-dimensional array including rows and a single column, and each row including a single SCC_cell; and a controller configured to adjust the at least one CDAC by selectively coupling none or some or all of the SCC_cells in the at least one SA_CDAC to the output node of the corresponding delay stage.

20. The delay chain of claim 19, wherein:

for each of the at least one SA_CDAC, each SCC_cell includes:

a switch and a capacitor coupled in series between the output node of the corresponding delay stage and a first reference voltage; and a decoder configured to receive corresponding addressing signals and generate a switch-state control signal to control the switch to be in an open state or a closed state.

* * * * *